(12) United States Patent
Matsunaga et al.

(10) Patent No.: US 6,790,681 B2
(45) Date of Patent: Sep. 14, 2004

(54) SUBSTRATE PROCESSING APPARATUS AND SUBSTRATE PROCESSING METHOD

(75) Inventors: Masataka Matsunaga, Kumamoto-Ken (JP); Akira Miyata, Kumamoto-Ken (JP); Yuichi Douki, Kumamoto-Ken (JP)

(73) Assignee: Tokyo Elecetron Limited, Tokyo (JP)

( * ) Notice: Subject to any disclaimer, the term of this patent is extended or adjusted under 35 U.S.C. 154(b) by 4 days.

(21) Appl. No.: 10/173,079

(22) Filed: Jun. 18, 2002

(65) Prior Publication Data

US 2002/0197746 A1 Dec. 26, 2002

(30) Foreign Application Priority Data

Jun. 20, 2001 (JP) .......................................... 2001-186075

(51) Int. Cl.[7] .............................................. H01L 21/00
(52) U.S. Cl. .......................................... 438/5; 438/905
(58) Field of Search ............................ 438/5, 800, 971, 438/908

(56) References Cited

U.S. PATENT DOCUMENTS

| 5,015,177 A | * | 5/1991 | Iwata ........................... 432/121 |
| 5,516,608 A | * | 5/1996 | Hobbs et al. ................... 430/30 |
| 5,849,602 A | * | 12/1998 | Okamura et al. ............... 438/5 |

* cited by examiner

Primary Examiner—David Nhu
(74) Attorney, Agent, or Firm—Rader, Fishman & Grauer PLLC

(57) ABSTRACT

In this invention, a time period taken with a wafer W to be transferred to the heat processing apparatus in the post exposure baking unit through the out stage in the aligner, the wafer transfer mechanism, the transition unit, the wafer transfer mechanism, and the temperature regulation and transfer apparatus in the post exposure baking unit is controlled to be approximately constant.

11 Claims, 24 Drawing Sheets

SUBSTRATE PROCESSING APPARATUS AND SUBSTRATE PROCESSING METHOD

BACKGROUND OF THE INVENTION

1. Field of the Invention

The present invention relates to, for example, a substrate processing apparatus of a coating and developing process apparatus and the like, coating and developing a resist solution onto a semi-conductor wafer.

2. Description of the Related Art

In the process of photo-resist processing in semiconductor device fabrication, for example, a substrate such as a semiconductor wafer (hereinafter referred to as "a wafer") or the like undergoes exposure of a pattern, heating process, temperature regulating process, and then developing process. A coating and developing process apparatus has been used for such a series of processing.

This coating and developing process apparatus includes various kinds of processing units for individually performing a series of process required for coating and developing process of a wafer, for example, resist coating process applying a resist solution, heating process heating the wafer which has undergone exposing process, temperature regulating process regulating the temperature of the wafer which has undergone the heating process, and developing process performing a developing process to the wafer which has undergone the temperature regulating process. The wafer is carried into and out of each processing unit and transferred between the processing units with a main transfer mechanism.

Incidentally, it is known that a line width of a circuit pattern formed on a surface of a wafer is affected by a time period taken from the completion of the exposing process and the start of the heating process.

However, there is a problem in keeping a time period of transferring the substrate from the aligner to the heat processing portion for performing the heating process constant, since the substrate is kept awaited at an interface portion disposed on the coating and developing processing apparatus side for sending and receiving the substrate with the aligner because of the necessity of the interface portion to get access to a peripheral aligner and to transfer the wafer to the aligner side, apart from transferring the substrate carried out from the aligner into the apparatus.

SUMMARY OF THE INVENTION

The present invention is intended to solve such problem and the object thereof is to provide a substrate processing apparatus that is able to keep a time period between the exposing process and the heating process constant so that a circuit pattern formed on the substrate becomes uniform.

To solve the aforesaid problem, the substrate processing apparatus of the present invention performing a developing process to the substrate exposed by the aligner comprising, at least one heat processing portion heat processing the substrate before the developing process, an interface portion disposed between the heat processing portion and the aligner, sending and receiving the substrate between the heat processing portion and the aligner, and a controller controlling a time period taken in transferring the substrate received from the aligner to the heat processing portion through the interface portion before starting the, heating process on the substrate with the heat processing portion so that the time period become approximately constant.

Here, the process of controlling time mentioned above, includes, for example, making the time period constant with deliberately delaying time to start heating process on the substrate by the heat processing portion.

The present invention controls the time period taken in transferring the substrate received from the aligner to the heat processing portion through the interface portion and until the start of the heating process to be approximately constant so that the time taken from after the exposing process until the heating process can be kept constant, as a result, the line width of the circuit pattern formed on the substrate can be kept uniform.

According to an embodiment of the present invention, the heat processing portion has a heat processing plate performing the heating process to the substrate, and a first transferring portion receiving the substrate from the interface portion and transferring the substrate to the heat processing plate, and the controller controls a transferring speed that the first transferring portion transfers the substrate so that the time period taken in transferring the substrate received from the aligner to the heat processing portion through the interface portion before starting the heating process on the substrate with the heat processing portion become approximately constant.

According to an embodiment of the present invention, the heat processing portion has a heat processing plate performing the heating process to the substrate, and a first transferring portion receiving the substrate from the interface portion and transferring the substrate to the heat processing plate, wherein the controller controls a transferring speed that the first transferring portion transfers the substrate so that the time period taken in transferring the substrate received from the aligner to the heat processing portion through the interface portion before starting the heating process on the substrate with the heat processing portion becomes approximately constant. As one form of embodiment, the interface portion has a transferring system transferring the substrate at a constant speed and the controller at least one of allowing the substrate to wait at the first transferring portion for a while and decreasing the transferring speed of the first transferring portion when a transferring time of the substrate received from the aligner and transferred to the heat processing portion through the interface portion is shorter than a predetermined time period, the controller allows the first transferring portion to start the transportation immediately after receiving the substrate when the transferring time is the same as the predetermined time period, and the controller allows the first transferring portion to increase the transferring speed when the transferring time is longer than the predetermined time period. Consequently, the process of time controlling in relation to the present invention can be performed without imposing stress on the interface portion. According to one embodiment of the present invention, the first transferring portion has a portion regulating temperature of the substrate. As a result, the heating process can be constantly performed, and the line width of the circuit pattern formed on the substrate can be kept uniform. According to an embodiment of the present invention, the substrate processing apparatus has a plurality of heat processing portions which are disposed in multiple stages in vertical direction, the interface portion has a transferring system transferring the substrate from the aligner to the heat processing portion and the controller allows the substrate received from the aligner to be transferred to one of the plurality of heat processing portions through the interface portion and controls the transferring speed in the transferring system so that the time period taken by transferring the substrate to the heat processing portion and the time period taken before starting the heating process on the substrate with the heat processing portion become approximately constant Moreover, each of the heat processing portions has the heat processing plate performing the heating process to the substrate, and the first transferring portion receiving the substrate from the interface portion and transferring the substrate to the heat processing plate and it is preferable for the controller to control the transferring time with controlling the transferring speed of the first transferring portion when the transferring time is unable to be adequately controlled with the transferring system. With this embodiment, keeping the substrate awaited at the interface portion side can be avoided. As a result, the time period taken with the substrate to be transferred from the aligner to the heat processing portion can be shortened, while performing the process of controlling time according to the present invention. According to an embodiment of the present invention, the interface portion has a first interface portion disposed adjacent to the heat processing portion and a second interface portion disposed between the first interface portion and the aligner, wherein the first interface has a second transferring portion transferring the substrate between the heat processing portion, and the second interface portion, the second interface portion has a third transferring portion transferring the substrate between the first interface portion and the aligner. With this embodiment, keeping the substrate awaited at the interface portion side can be avoided. As a result, the time period taken with the substrate to be transferred from the aligner to the heat processing portion can be shortened, while performing the process of controlling time in relation to the present invention.

According to an embodiment of the present invention, the interface portion has a first holding portion holding the substrate transferred to the heat processing portion for a while, a second holding portion holding the substrate transferred to the aligner for a while. The second interface portion has a transitional portion holding the substrate transferred between the first interface portion and the second interface portion for a while, a wafer transfer mechanism transferring the substrate by getting access to the heat processing portion, the first and the second holding portions, and the transitional portion. With this embodiment, keeping the substrate awaited at the interface portion side can be avoided. As a result, the time period taken in transferring the substrate can be shortened while performing the time controlling in relation to the present invention.

According to the present invention explained above, the present invention further comprises a signal input port inputting a substrate ejecting signal coming from the aligner and when the controller starts counting time in a process of controlling the time period to be constant in accordance with the substrate ejecting signal inputted in the signal input port the process of time controlling can be performed more precisely and accurately.

The substrate processing method of the present invention performing a heating process in a heat processing portion before performing a developing process to a substrate exposed with an aligner, comprising the steps of transferring the substrate received from the aligner to the heat processing portion, and controlling a time period so that the time period taken in transferring the substrate received from the aligner to the heat processing portion until the heating process is started on the substrate with the heat processing portion becomes approximately constant.

The present invention controls the time period taken in transferring the substrate received from the aligner to the heat processing portion until starting the heating process to be approximately constant so that the time taken from the exposing process until the heating process is performed can be kept constant, and as a result the line width of the circuit pattern formed on the substrate can be kept uniform.

These objects and still other objects and advantages of the present invention will become apparent upon reading the following specification when taken in conjunction with the accompanying drawings.

DETAILED DESCRIPTION OF THE PREFERRED EMBODIMENT

Preferred embodiments of the present invention will be explained below with reference to the drawings.

Figure 1:
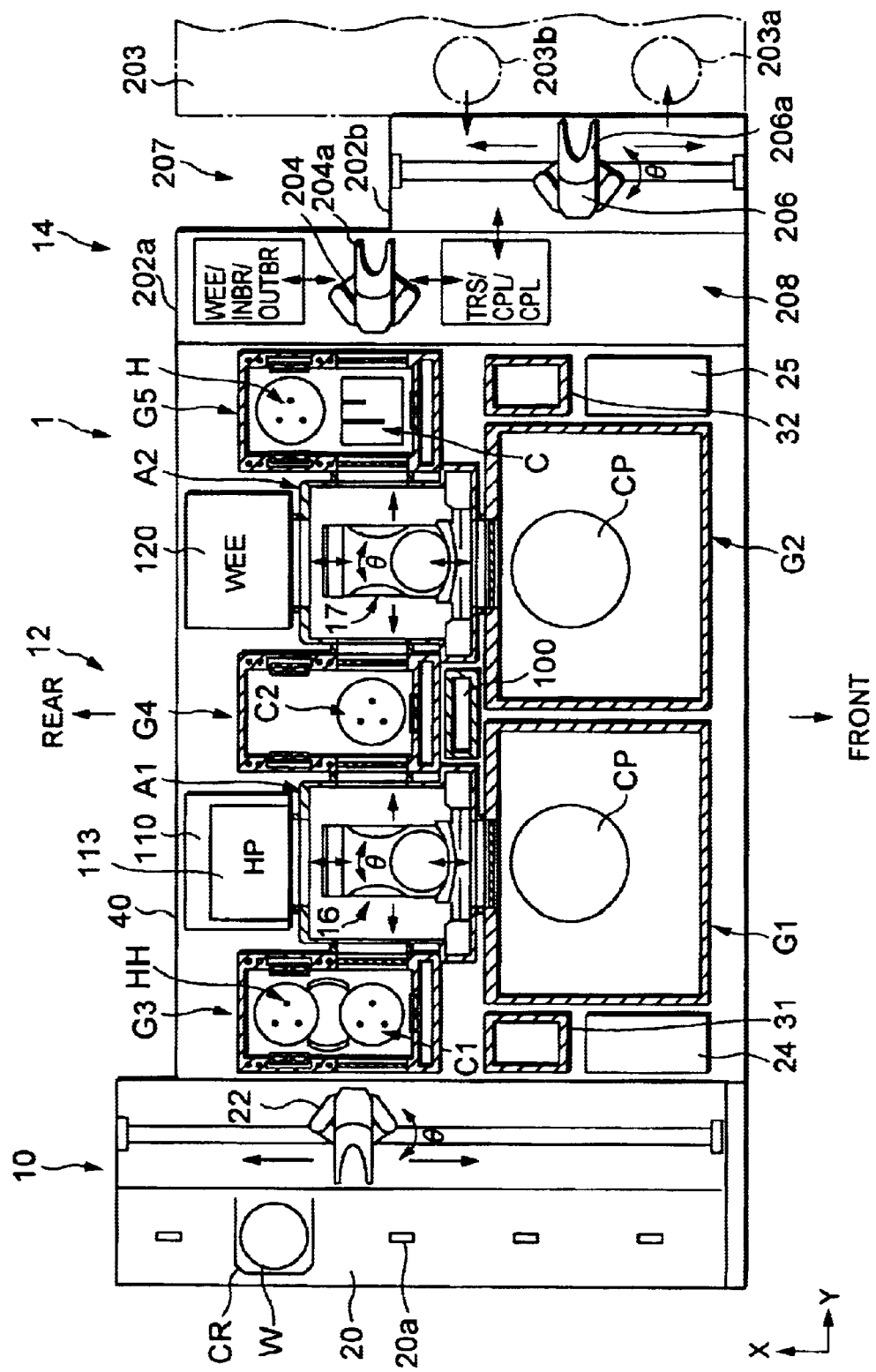
FIG. 1 is a plan view showing the entire structure of a substrate processing apparatus according to a first embodiment of the present invention.
Figure 2:
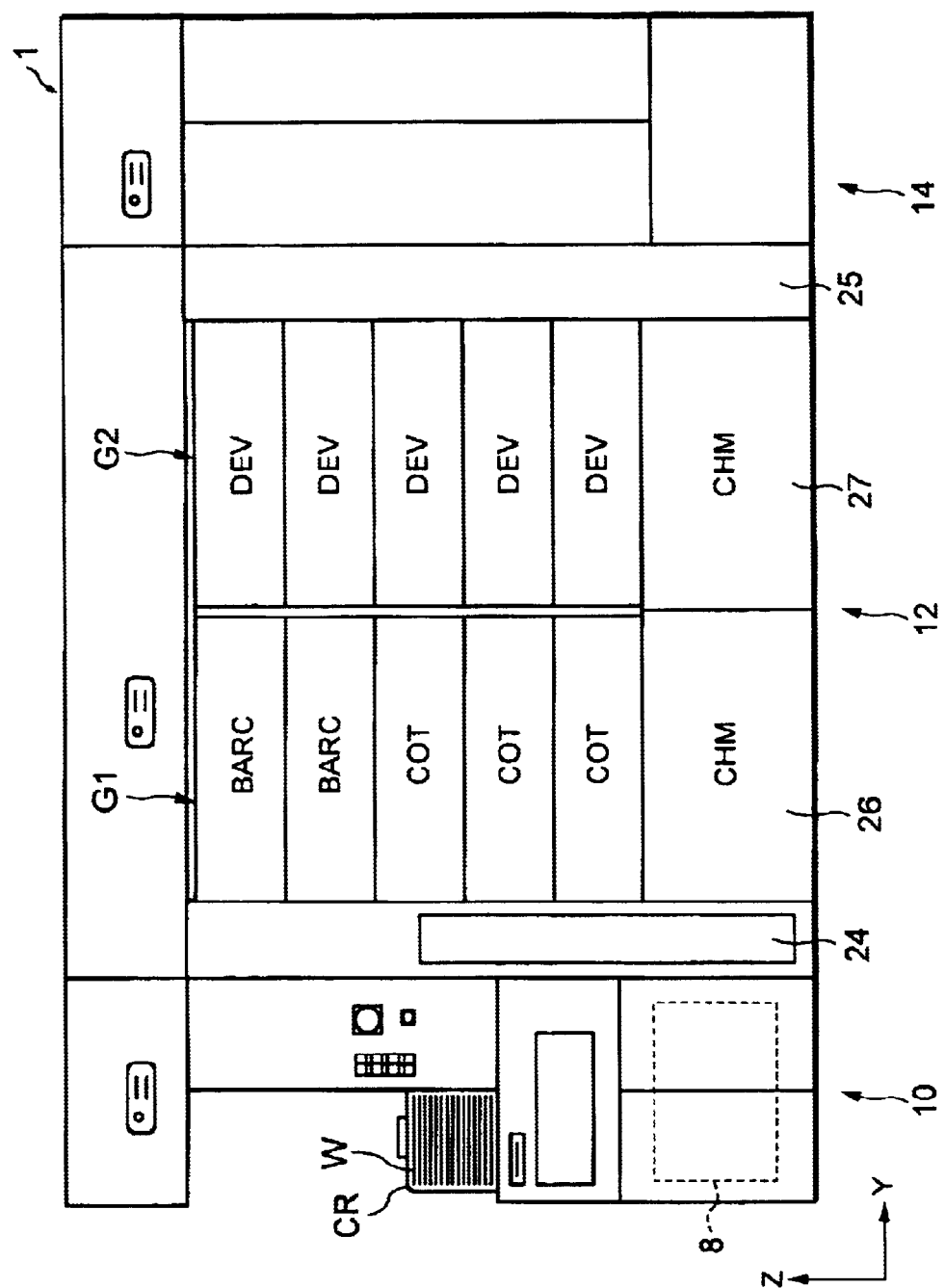
FIG. 2 is a front view showing the entire structure of the substrate processing apparatus.
Figure 3:
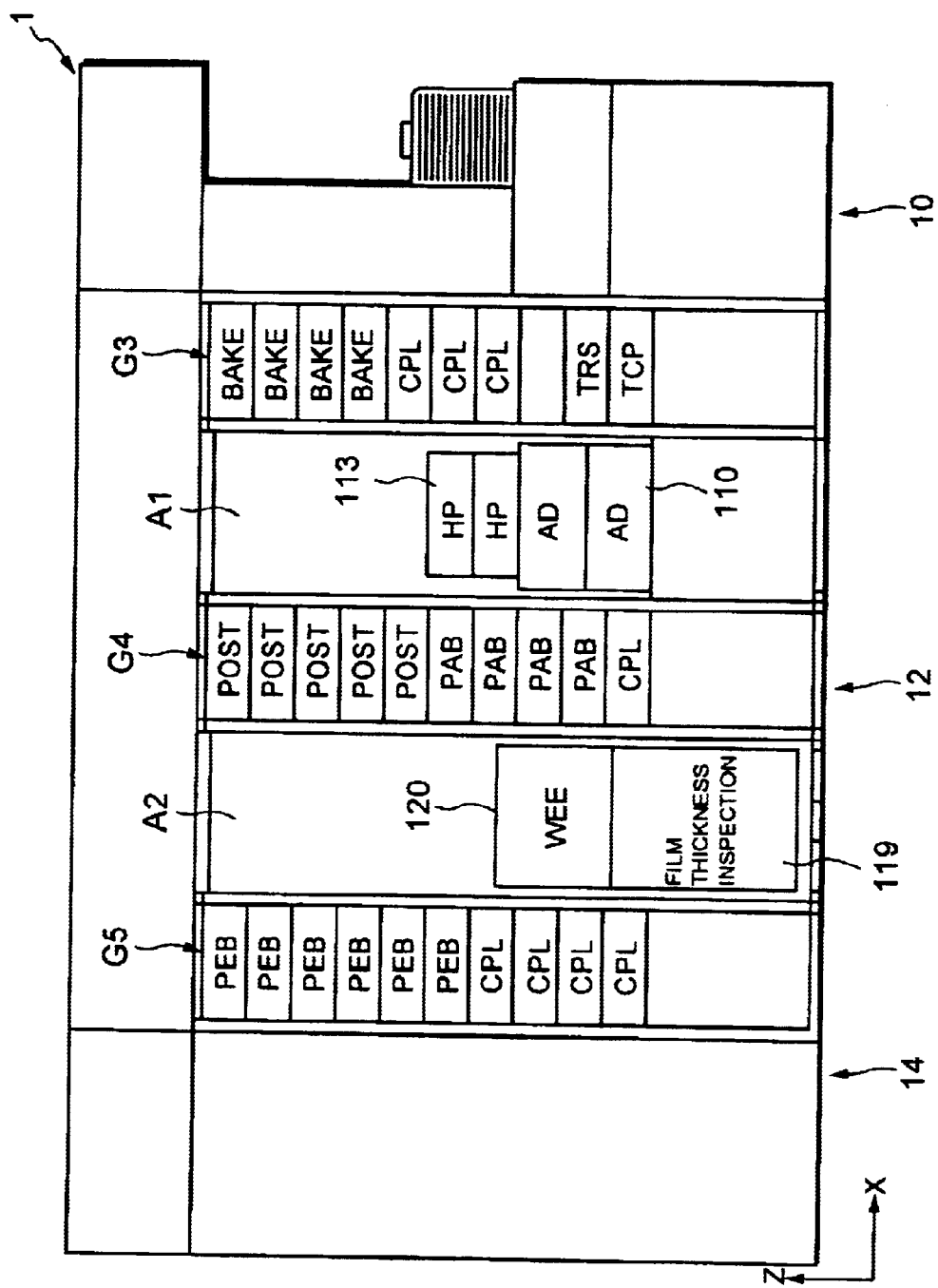
FIG. 3 is a rear view showing the entire structure of the substrate processing apparatus.

FIG. 1, FIG. 2 and FIG. 3 are drawings showing the entire structure of a substrate processing apparatus according to an embodiment of the present invention. FIG. 1 is a plan view, FIG. 2 is a front view, and FIG. 3 is a rear view.

The substrate processing apparatus 1 has a structure in which a cassette station 10 as an entering portion, sending and receiving a plurality of, for example, 25 wafer Ws per wafer cassette CR, as a unit, from the outside into the system and from the system to the outside and carrying the wafer W into and out of the wafer cassette CR, a processing station 12 in which various kinds of processing units each performing a predetermined process for the wafer W one by one in coating and developing process steps are multi-staged, and an interface section 14 for receiving and sending the wafer W to and from an aligner, provided adjacent to the processing station 12 are integrally connected.

In the cassette station 10, a plurality of, for example, five wafer cassettes CR are mounted in a line in an X-direction at the positions of projections 20a on a cassette mounting table 20 with respective wafer transfer ports facing the processing station 12 side. A wafer transfer mechanism 22 movable in the direction of arrangement of cassettes (the X-direction) and in the direction of arrangement of the wafers housed in the wafer cassette CR (a Z-direction) selectively gets access to each of the wafer cassettes CR. Moreover, this wafer transfer mechanism 22 is also structured to be able to rotate in a θ-direction so as to get access to a heat processing system units included in a third processing unit section G3 as shown in FIG. 3, structured in multiple stages, which will be described later.

As shown in FIG. 1, in the processing station 12, a third processing unit section G3, a fourth processing unit section G4, and a fifth processing unit section G5 are arranged in order from the cassette station 10 side in the rear side of the apparatus (the upper side in FIG. 1), and a first main wafer transfer portion A1 as a first main transfer portion is provided between the third processing unit section G3 and the fourth processing unit section G4. As will be described later, the first main wafer transfer portion A1 is placed so that a first main wafer transfer mechanism 16 can selectively get access to a first processing unit section G1, the third processing unit section G3, the fourth processing unit section G4, or the like. A second main wafer transfer portion A2 as a second main transfer portion is provided between the fourth processing unit section G4 and the fifth processing unit section G5, and the second main wafer transfer portion A2 is placed so that a second main wafer transfer mechanism 17 can selectively get access to a second processing unit section G2, the fourth processing unit section G4, the fifth processing unit section G5, or the like.

Moreover, thermal processing units are placed at the rear side of the first main wafer transfer portion A1, and two adhesion units (AD) 110 for performing hydrophobic processing on the wafer W and two heating units (HP) 113 for heating the wafer W, for example, are sequentially placed from the lower part as shown in FIG. 3. The adhesion unit (AD) may be structured to further include a mechanism for regulating the temperature of the wafer W. A peripheral aligner (WEE) 120 for selectively exposing only an edge portion of the wafer W and an inspection apparatus 119 as an inspection section for inspecting the thickness of a resist film applied on the wafer W are placed at the rear side of the second main wafer transfer portion A2. The peripheral aligner (WEE) 120 and the inspection apparatus 119 may be disposed in multiple stages. In some cases, thermal processing units are arranged at the rear side of the second main wafer transfer portion A2 similar to the rear side of the first main wafer transfer portion A1.

As shown in FIG. 3, in the third processing unit section G3, oven-type processing units each for performing predetermined process while the wafer W is placed on a mounting table, for example, a high-temperature thermal processing unit (BAKE) being a first thermal processing unit for performing a predetermined heating process for the wafer W, a high-precision temperature regulating unit (CPL) each for performing heating process for the wafer W under precise temperature control, a transition unit (TRS) being a delivery section of the wafer W from a wafer transfer mechanism 22 to the main wafer transfer mechanism 16, and a temperature regulating unit (TCD) are, for example, ten-staged from the top in order. Incidentally, a unit at the third stage from the bottom is provided as a spare space. Also, in the fourth processing unit section G4, for example, a post-baking unit (POST) as a fourth thermal processing unit, a pre-baking unit (PAB) being a second thermal processing unit performing heating process for the wafer W which has undergone resist coating, and a high-precision temperature regulating unit (CPL) are, for example, ten-staged from the top in order. Furthermore, in the fifth processing unit section G5, for example, a post-exposure baking unit (PEB) as a third thermal processing unit performing heating process for the wafer W which has undergone exposure, and high-precision temperature regulating units (CPL) are, for example, ten-staged from the top in order.

In FIG. 1, the first processing unit section G1 and the second processing unit section G2 are disposed side by side in the Y-direction at the front of the apparatus (the lower side in FIG. 1) in the processing station 12. Solution temperature regulating pumps 24 and 25 used for regulating the temperature of a processing solution to be supplied to the processing unit sections G1 and G2 are provided respectively between the first processing unit section G1 and the cassette station 10, and between the second processing unit section G2 and the interface section 14. Moreover, ducts 31 and 32 for supplying clean air from an air regulator (not illustrated) provided outside the processing apparatus into each of the processing unit sections G1 to G5.

As shown in FIG. 2, in the first processing unit section G1, five spinner-type processing units as solution supplying units each for performing predetermined process while the semiconductor wafer W is placed on a spin chuck in a cup CP, for example, three resist coating units (COT) and two bottom coating units (BARC) each for forming an anti-reflection film in order to prevent reflection of light at the time of exposure are five-staged from the bottom in order. Also, in the second processing unit section G2, five spinner-type processing units, for example, developing units (DEV) are five-staged from the bottom in order. Since the drainage of a resist solution is troublesome in terms of both mechanism and maintenance in the resist coating unit (COT), it is desirable to place the resist coating unit at the lower tier. However, it is possible to place at upper tier as required.

The aforesaid first to fifth processing unit sections G1 to G5, the adhesion unit (AD) 110, the heating unit (HP) 113, the exposing process apparatus (WEE) 120, the inspection apparatus 119 can be removed for maintenance, and in addition, a panel 40 (See FIG. 1) at the rear side of the processing station 12 is attached to be removable or to be able to open and close.

At the lowest stages of the first and second processing unit sections G1 and G2, chemical chambers (CHM) 26 and 27 as solution supplying mechanisms supplying the aforesaid processing solution to the processing unit sections G1 and G2 are provided respectively.

Incidentally, an integrated control section 8 controlling the whole system of the substrate processing apparatus 1 is provided at the lower portion of the cassette station 10.

Figure 4:
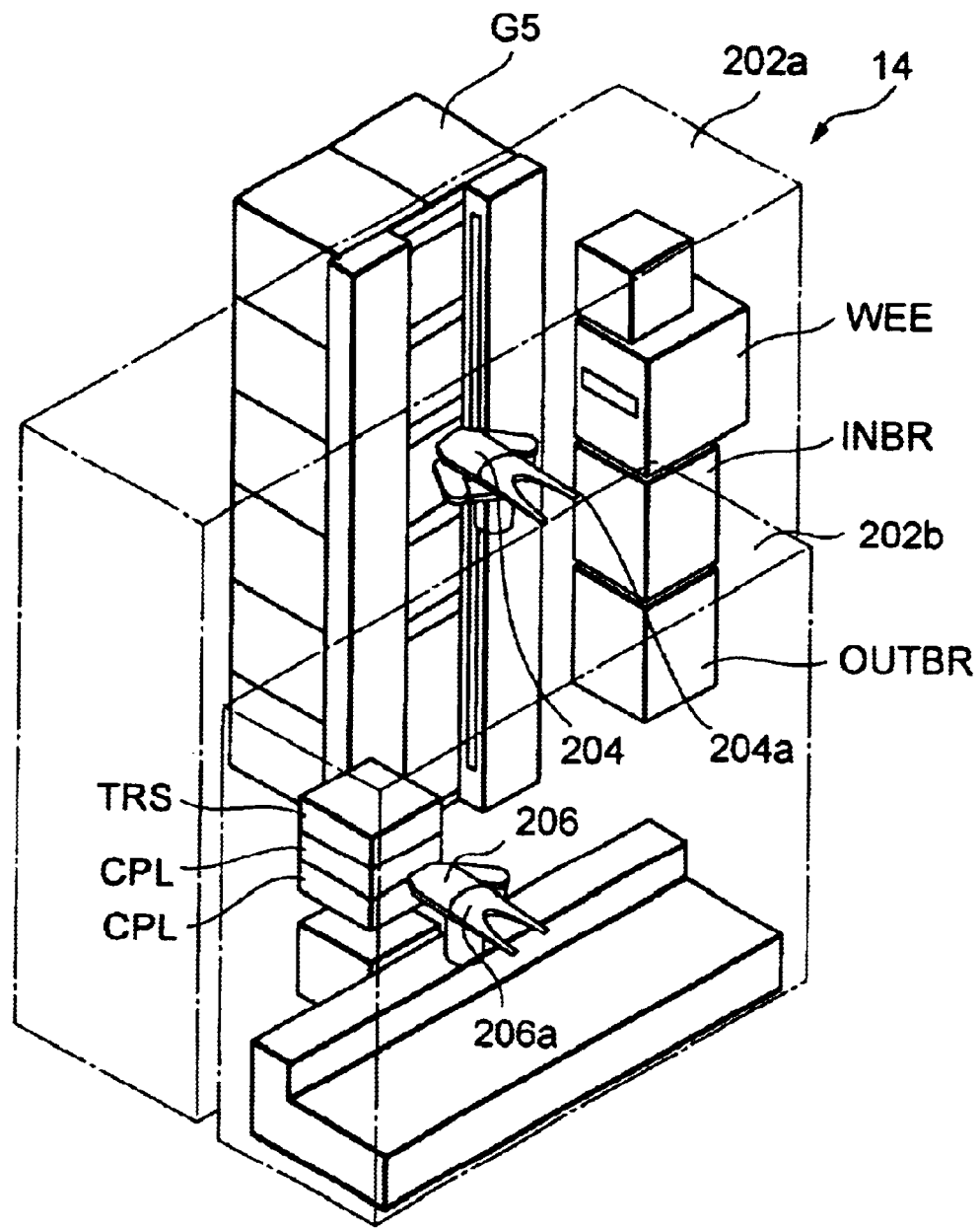
FIG. 4 is a perspective view showing the interface portion of the substrate processing apparatus as illustrated in FIG. 1.

In the interface portion 14, two columns of the first and the second interface portions 202a and 202b are placed between the aligner 203 as illustrated in FIG. 1 and FIG. 4.

In the first interface portion 202a, a wafer transfer mechanism 204 is placed opposite to an opening of the fifth thermal processing unit portion G5.

At the rear side, facing the wafer transfer mechanism 204, a peripheral aligner WEE, an in-buffer cassette INBR, and an out buffer cassette OUTBR are disposed in multiple stages in order from the top. The in-buffer cassette INBR houses wafer Ws for a while before being carried into the aligner 203, housing, for example, about 25 wafers. The out-buffer cassette OUTBR houses wafer Ws for a while after being carried out from the aligner 203, housing, for example, about 25 wafer W.

A transition unit TRS and two stages of high-precision temperature regulating units are disposed in multiple stages facing the wafer transfer mechanism 204 on the front side of the wafer transfer mechanism 204. The transition unit TRS, for example, comprised of three support pins (not illustrated) supporting wafer W on the pedestal, and an opening from which both the wafer transfer mechanism 204 in the first interface portion 202a and the wafer transfer mechanism 206 in the second interface portion 202b is able to get access. The high-precision temperature regulating units CPL has an opening so that both the wafer transfer mechanism 204 in the first interface portion 202a and the wafer transfer mechanism 206 in the second interface portion 202b is able to get access.

The wafer transfer mechanism 204 is movable in Z-direction and rotatable in θ-direction, has two forks 204a, top and bottom, receiving and sends the substrate and structured to be movable back and forth. The forks 204a in the wafer transfer mechanism 204 get access to each opening of the fifth thermal processing unit portion G5, the peripheral aligners WEE, the in-buffer cassette INBR, the out-buffer cassette OUTBR, the transition unit TRS, and two stages of the high-precision temperature regulating units CPL, receives and sends the wafer W with these portions with using a separate fork 204, and transferring the wafer W.

The wafer transfer mechanism 206, which is movable in Y and Z direction and rotatable in θ direction, is disposed in the second interface portion 202b. The wafer transfer mechanism 206 transfers the wafer W with a pin 206a that is movable back and forth receiving and sending the wafer W which gets access to the transition unit TRS, each of two stages of the high-precision temperature regulating units CPL, the in-stage 203a in the aligner 203, an out-stage 203b, transferring the wafer W between these units.

Next, the structure of the first main wafer transfer portion A1 as a main transfer portion is explained referencing FIG. 5 to FIG. 11. Incidentally, the second main wafer transfer portion A2 has the same structure as the first main wafer transfer portion A1, thus the explanation thereof is omitted.

Figure 5:
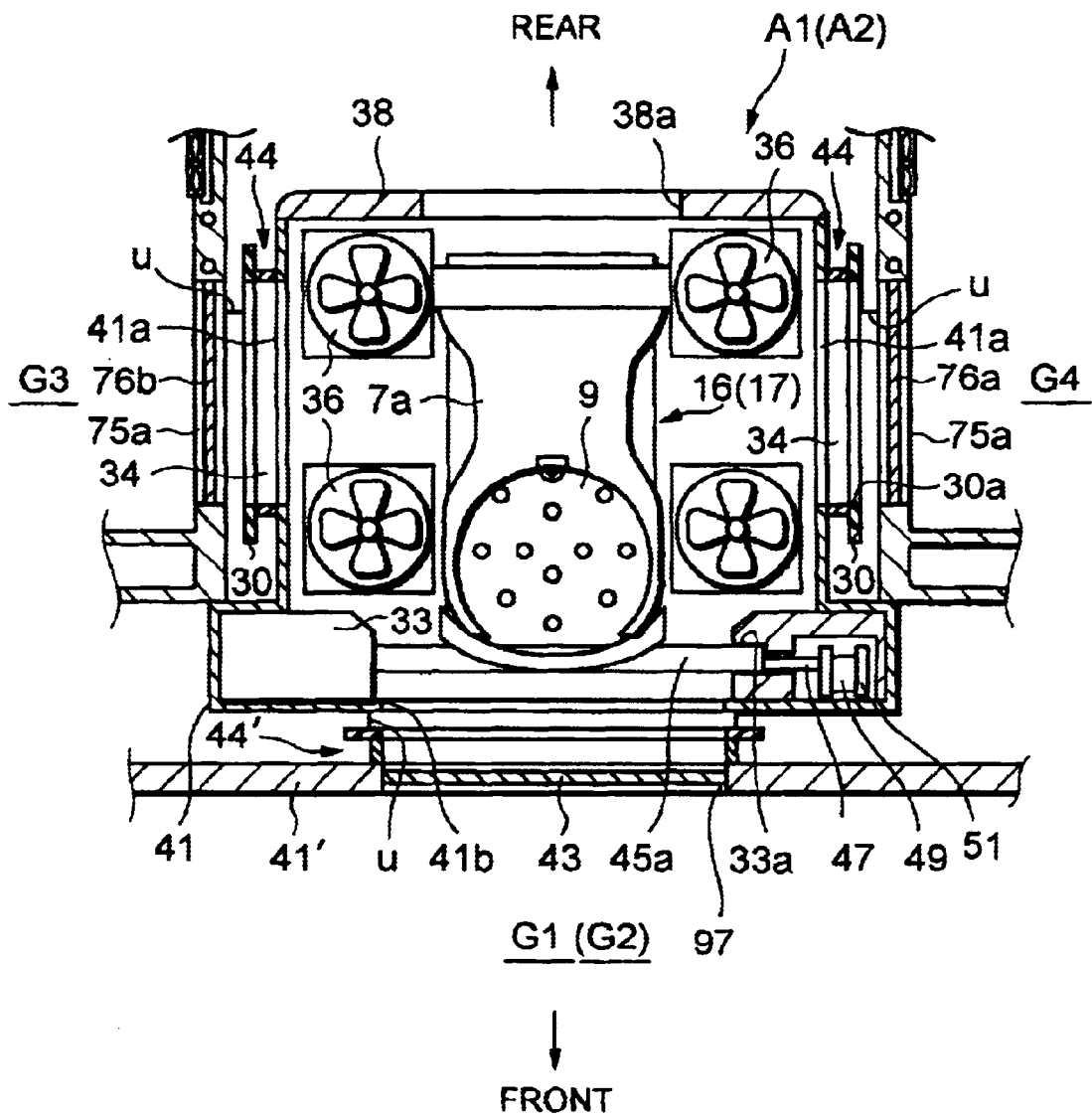
FIG. 5 is a sectional view of a main wafer transfer portion according to the embodiment of the present invention.
Figure 6:
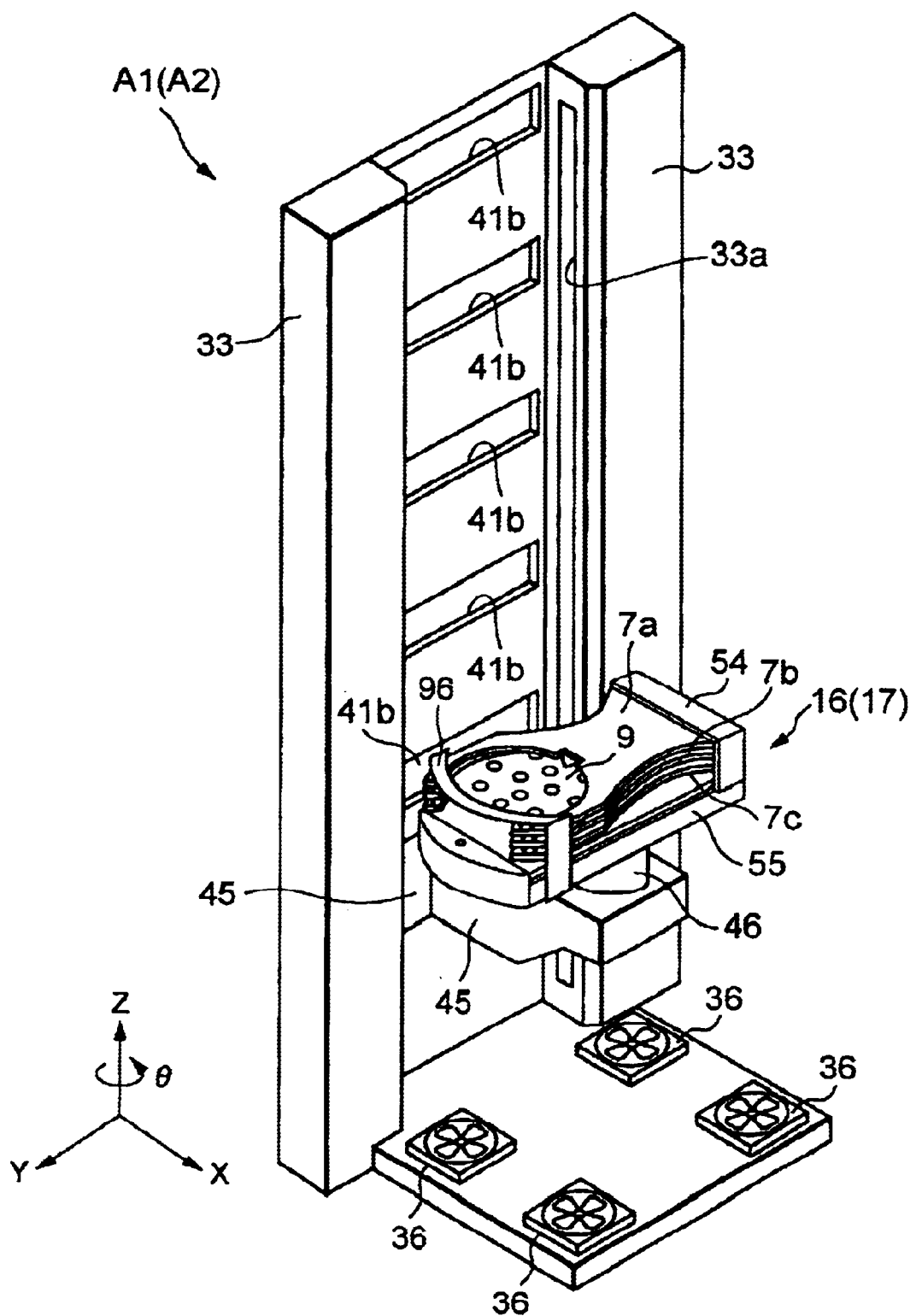
FIG. 6 is a perspective view showing a critical portion of the main wafer transfer portion.
Figure 7:
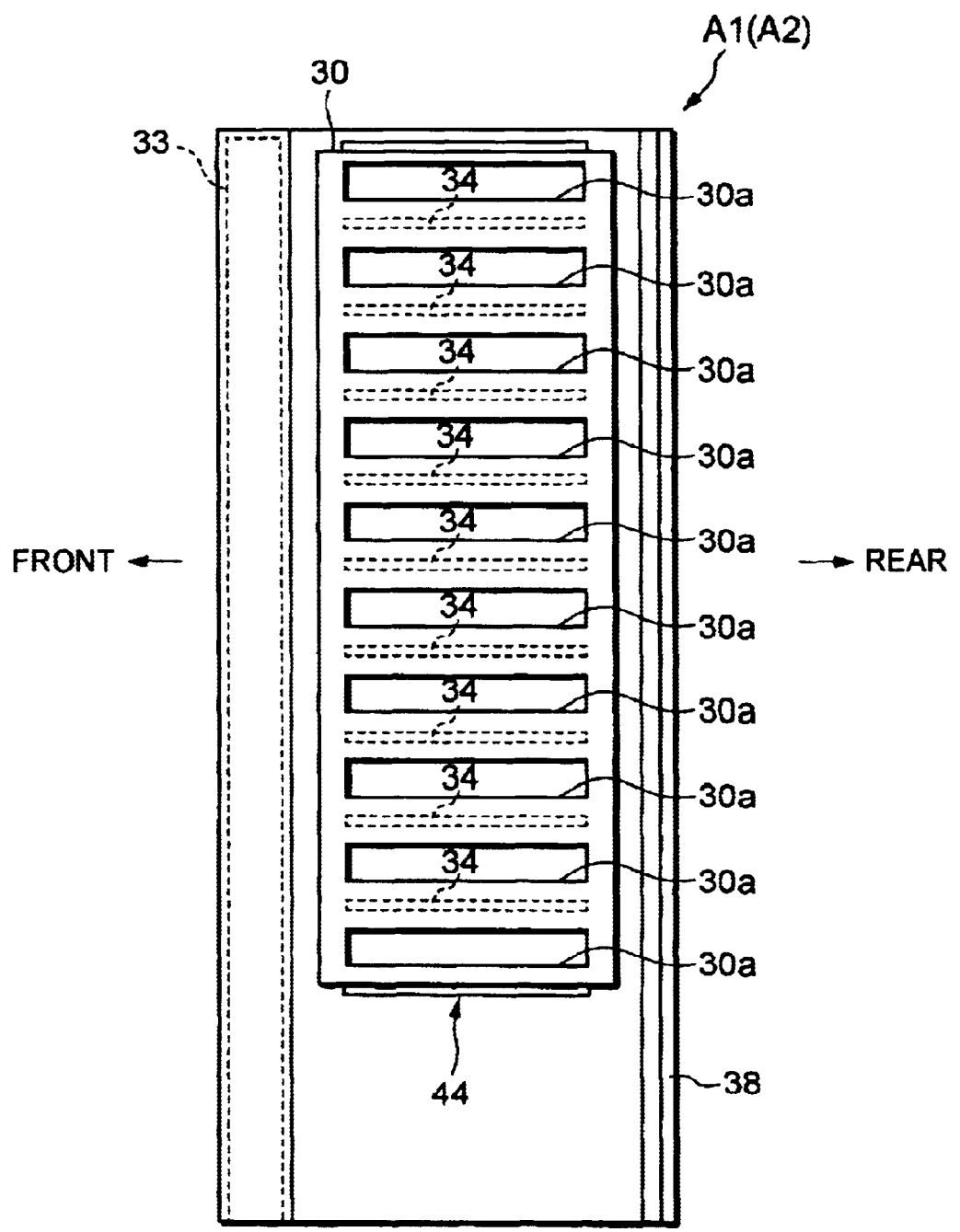
FIG. 7 is a side view of the main wafer transfer portion.

In FIG. 5, the main wafer transfer portion A1 is surrounded by a casing 41 and a door 38 attached to be able to open and close on the rear side of the casing 41, and the illustration of the casing 41 and the door 38 are omitted in FIG. 6 for making the explanation clearly understandable. A window 38a is provided in the door 38 so that access to the adhesion unit (AD) 110, access to the peripheral aligner 120 and the inspection apparatus 119 in the case of the second main wafer transfer portion A2 can be obtained. Windows 41b and 41a are provided respectively at the front face and each side face in the casing 41 so that access to the outside can be obtained. The front windows 41b are provided at five positions so that the wafer W is received and sent with the first processing unit section G1 having five stages (See FIG. 6) through each window, whereas the side windows 41a are provided at ten positions so that wafer W is received and sent with at least one of the third and the fourth processing unit section G3 or G4 having ten stages through each window as shown in FIG. 7. It is possible to increase or decrease the number of the windows as required. Attached at each of the side faces of the casing 41 is a surrounding member 44 for connecting the casing 41 and the third and the fourth processing unit section G3 and G4 with a small gap u between the casing 41 and the processing unit section G3 and G4. The gap u has a distance capable of preventing the occurrence and entry of particles, for example, a distance of 0.5 mm. An impact absorbent packing 30 is provided on each of the processing unit sections G3 and G4 sides of the surrounding members 44 and, as shown in FIG. 7, corresponding windows 30a are also provided in the packing 30. In the surrounding member, partition plates 34 are provided to separate respective windows 30a.

In FIG. 5, a surrounding member 44' having the same structure as the surrounding member 44 is attached at a position corresponding to five openings 97 provided in a casing 41' on the first and the second processing section G1 and G2 side with a small gap u (for example, 0.5 mm) from the main wafer transfer portion A1 (A2).

At the bottom of the first main wafer transfer portion A1, four fans 36 controlling the inside pressure, temperature, and humidity are disposed. The operation of these fans 36 is controlled with the integrated control section 8 (See FIG. 2).

Figure 8:
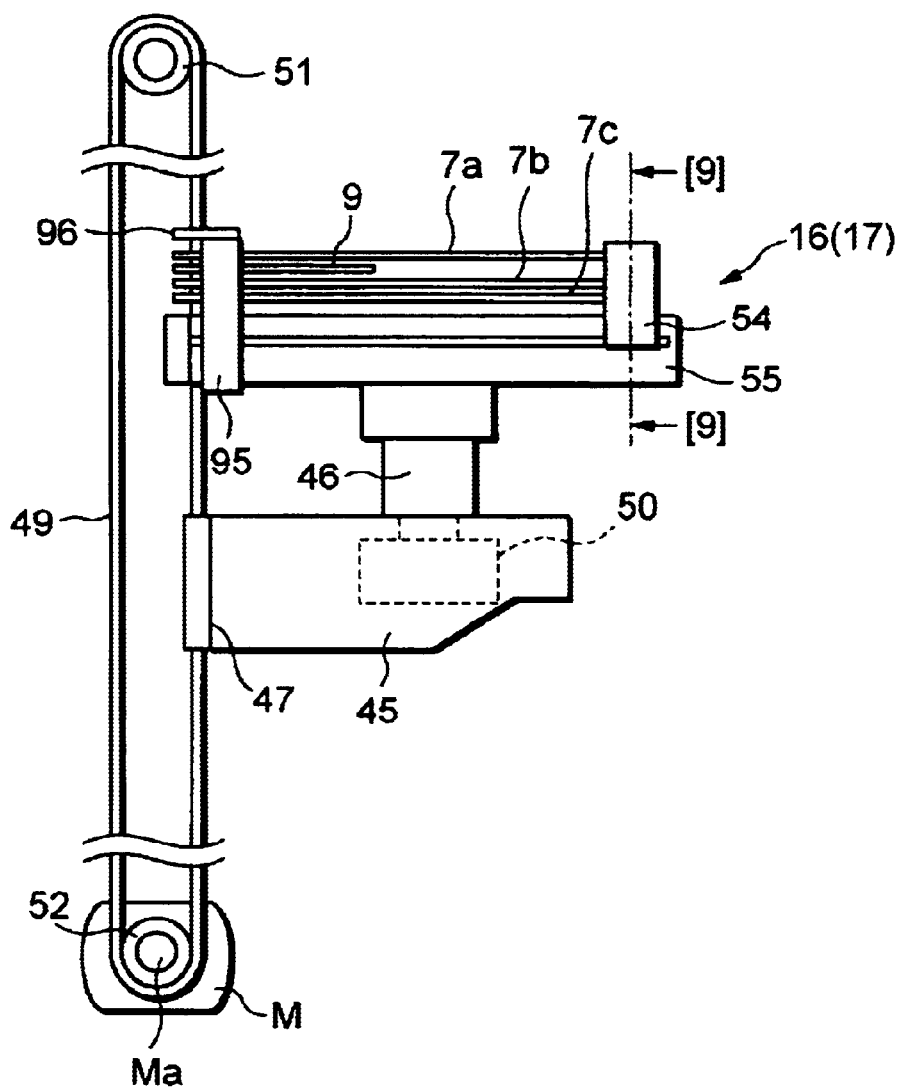
FIG. 8 is a side view showing a driving mechanism of a main wafer transfer mechanism in the main wafer transfer portion.

As shown in FIG. 5 and FIG. 6, vertical poles 33 are placed at the first processing unit section G1 side and the second processing unit section G2 in the casing 44. Inside of one of the poles 33, a pair of pulleys 51 and 52 is placed at the upper end portion and the lower end portion respectively, as illustrated in FIG. 8, and an endless belt 49 being a vertical drive means is stretched between the pulleys 51 and 52. A support portion 45 of the first main wafer transfer mechanism 16 is connected to the vertical drive belt 49 with a belt clamp 47 between them. Furthermore, as shown in FIG. 5 and FIG. 6, a flange portion 45a is provided at the support portion 45, and the flange portion 45a is slidably engaged with sleeves 33a formed in both the poles 33. The lower pulley 52 is connected to a rotating shaft Ma of a drive motor M fixed to the bottom of the pole 33 to compose a drive pulley. The aforesaid vertical belt driving mechanism and vertical slide mechanism enables the main wafer transfer mechanism 16 to ascend and descend in a vertical direction by driving force of the drive motor M.

The aforesaid ascending and descending mechanism is provided similarly inside the other pole 33, but the drive motor M can be omitted in the other pole 33.

The main wafer transfer mechanism 16 contains a motor 50 in the support portion 45. A rotating rod 46 which is rotatable in the θ-direction is connected to the motor 50 (See FIG. 6), and an arm base end portion 55 being a base end of three arms 7a, 7b, and 7c is fixed to the upper end of the rotating rod 46.

Figure 9:
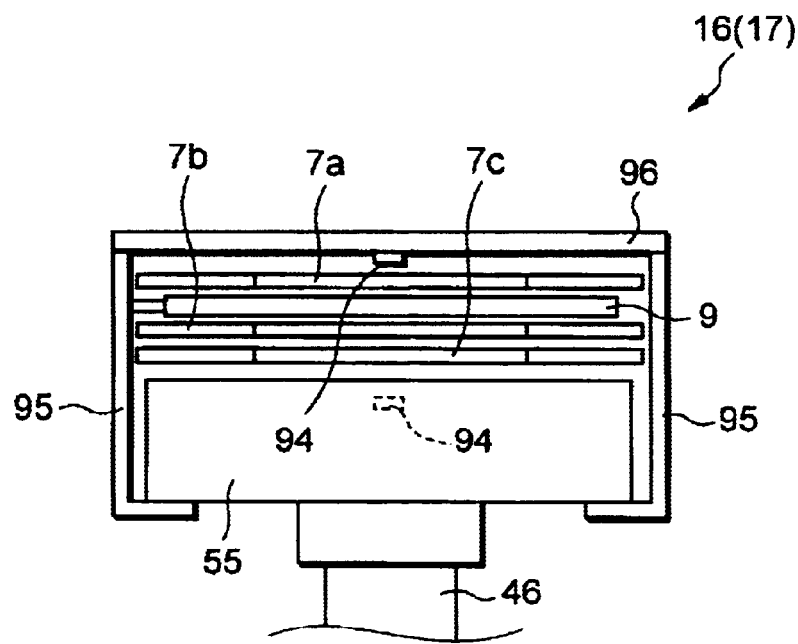
FIG. 9 is a front view of the main wafer transfer mechanism.

FIG. 9 is a front view of the main wafer transfer mechanism 16 in the state of FIG. 5. Vertical members 95 are attached on both sides of a forward end portions of the arm base end portion 55, and attached to the vertical members 95 is a shielding plate 9 for blocking off radiation heat from the upper arm 7a and the middle arm 7b. Furthermore, an attaching member 96 connecting the two vertical members 95 is disposed. A pair of optical sensors 94 are provided at the center of the attaching member 96 and the forward end of the arm base end portion 55, whereby the presence or absence of the wafer W on each arm and the misalignment of the wafer W are confirmed.

Figure 10:
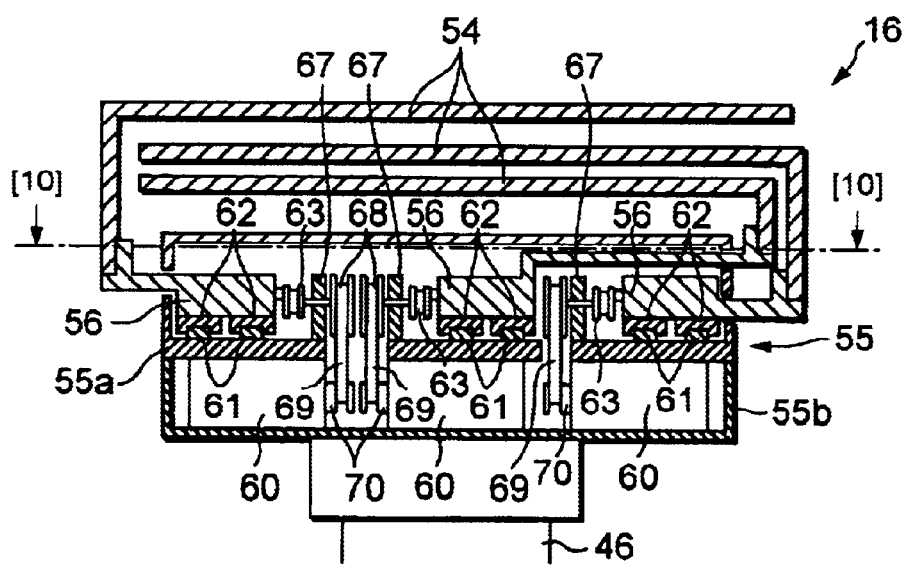
FIG. 10 is a sectional view of the main wafer transfer mechanism.
Figure 11:
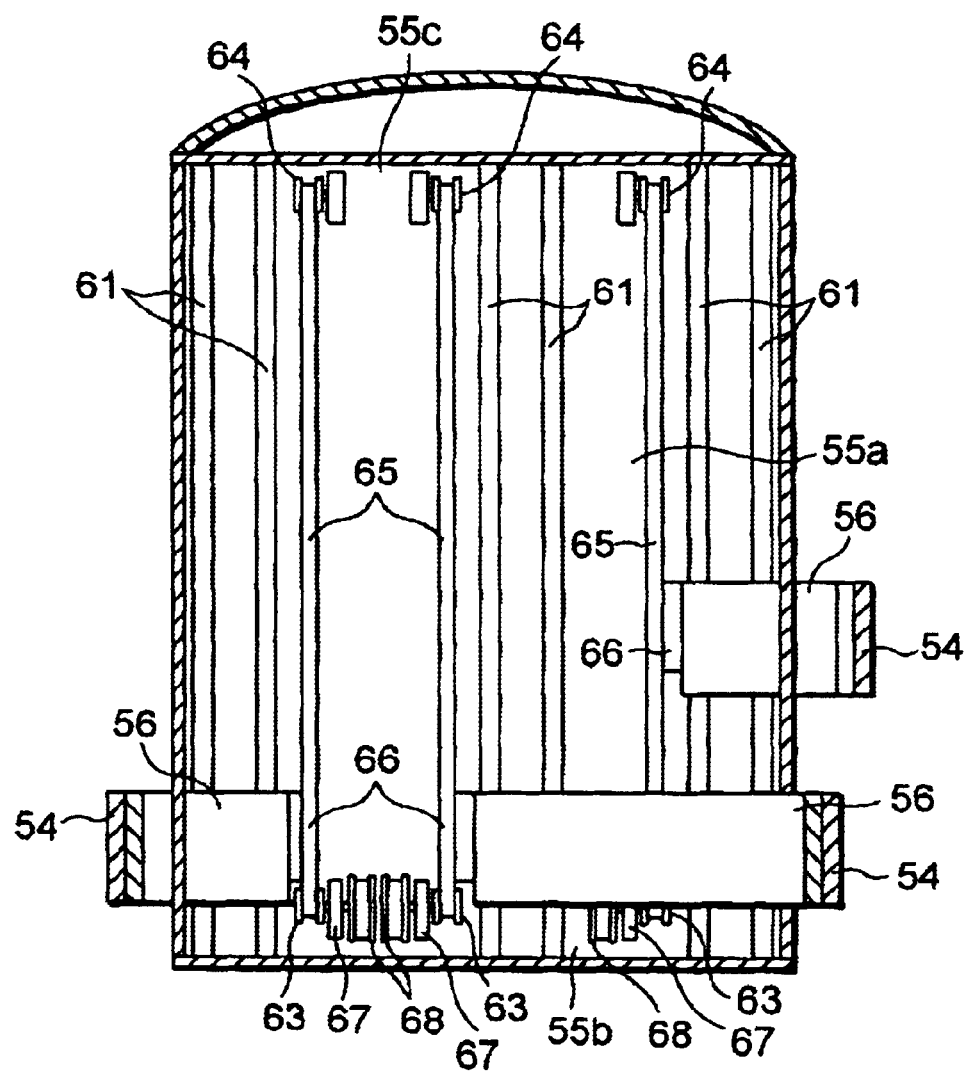
FIG. 11 is a sectional view divided along the line [10]—[10] in FIG. 10.

FIG. 10 is a sectional view showing the structure of the base end portion 55 of the main wafer transfer mechanism 16, and FIG. 11 is a sectional view taken along the line [10]—[10] in FIG. 10. An arm supporting plate 54 is fixed to each of the arm base end portions of the arms 7a to 7c. Each of the arm supporting plates 54 is formed into a sectional L-shape, and an arm carriage 56 movable along rails 61 laid on a base 55a of the base end portion 55 in the longitudinal direction of the arm is fixedly attached to each of the arm supporting plates 54.

Guides 62 slidably engaged with the rails 61 are provided at the lower portion of each of the arm carriages 56. The inner face of the arm carriage 56 is fixed to a drive belt 65 stretched between a pulley 63 placed near an arm original position (a base end portion 55b of the base 55) and a pulley 64 placed near an arm forward movement end position (a forward end portion 55c of the base 55) with a belt clamp 66 between them. The pulleys 63 are coaxially connected to pulleys 68 with bearings 67 respectively, these pulleys 68 are connected to pulleys 70 with drive belts 69 respectively, and the pulleys 70 are fixed to rotating shafts of drive motors 60 respectively.

When the rotating shaft of each of the motors 60 rotates, each of the pulleys 63 rotates via the pulley 70, the drive belt 69, and the pulley 63, each of the drive belts 65 is driven by the rotational drive of each of the pulleys 63, and each of the arm carriages 56 moves on the rails 61 with each of the drive belts 65. The direction of movement is determined by the direction of rotation of each of the motors 60. The motors are naturally driven independently of each other, and the arms 7a to 7b can be moved independently of each other.

The aforesaid structure of the main wafer transfer mechanism 16 allows each of the arms 7a to 7c to rotate in the θ-direction and move in the X-, the Y-, and the Z-direction so as to be able to get access to the processing unit sections G1, G3, and G4 as described above.

Next, with reference to FIG. 12 to FIG. 14, the pre-baking unit (PAB), the post-exposure baking unit (PEB), and the post-baking unit (POST) out of ten-staged units included in the fourth processing unit section G4 and the fifth processing unit section G5 will be explained. These baking units are different only in processing temperature.

Figure 12:
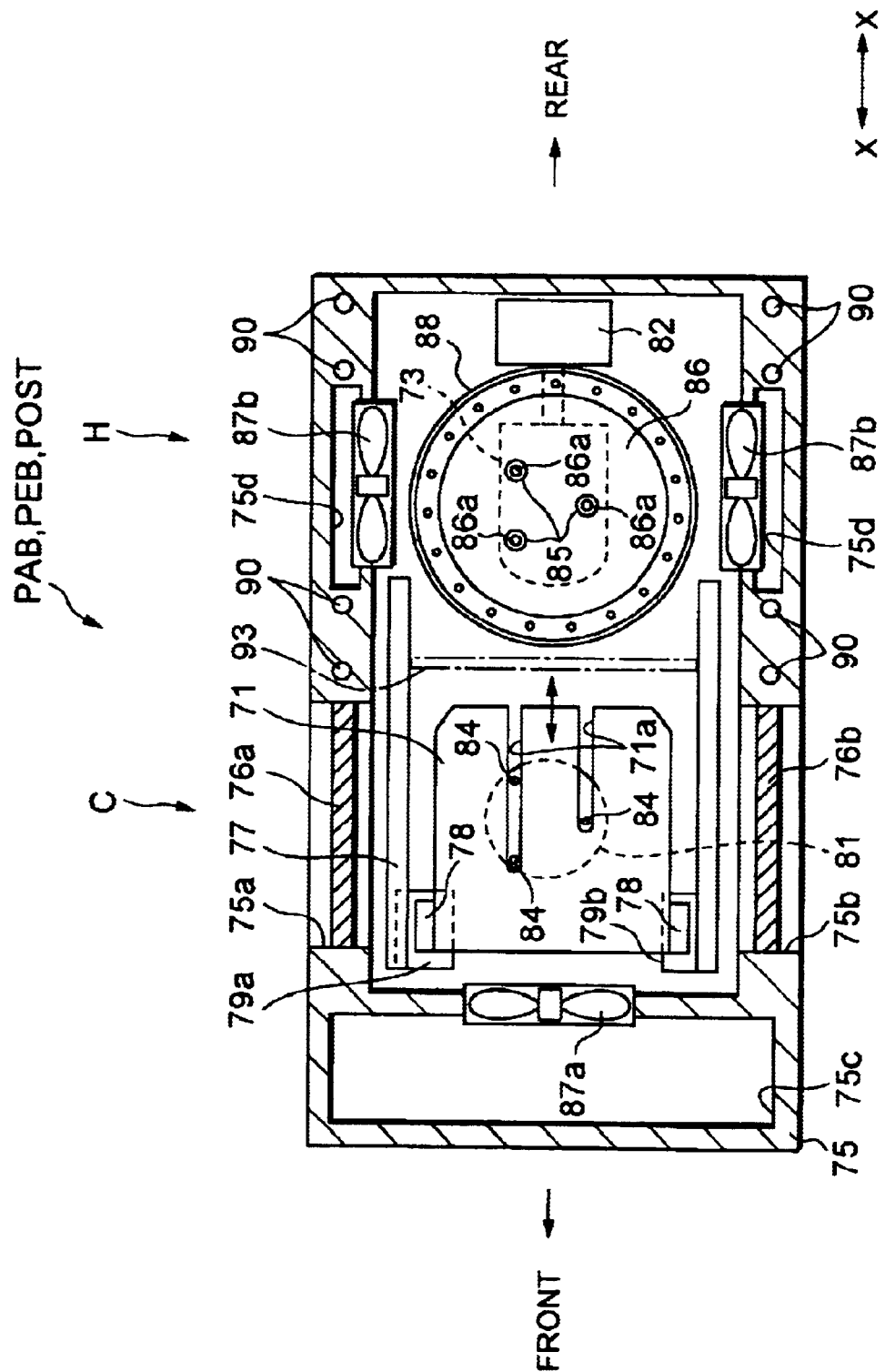
FIG. 12 is a horizontal sectional view of thermal processing units, namely, a pre-baking unit (PAB), a post-exposure baking unit (PEB), or a post-baking unit (POST) according to the embodiment of the present invention.
Figure 13:
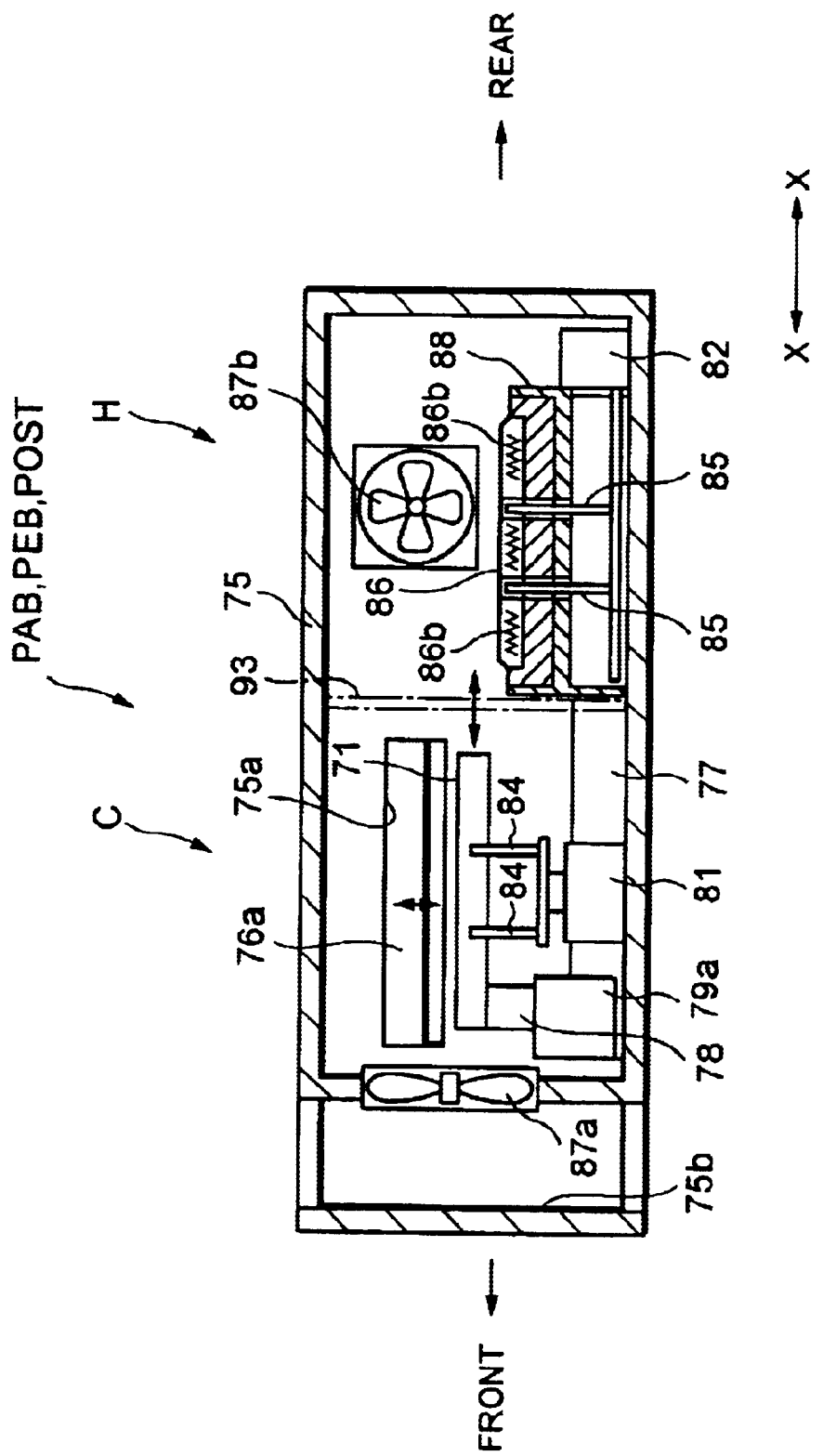
FIG. 13 is a vertical sectional view of the thermal processing units.

As shown in FIG. 12, such a heating process unit has a heat processing apparatus H at the front side of the system and a temperature regulation and transfer apparatus C at the rear side thereof in a casing 75. In the heat processing apparatus H, a hot plate 86 being heated by a heating wire 86b with a proper heat insulating material provided in a cylindrical supporting body 88 is provided. Under the supporting body 88, three pins 85 for delivering the wafer W are disposed be ascendable and descendable by a driving apparatus 82. The three pins 85 are placed while being retracted into through-holes 86a formed in the hot plate 86.

Meanwhile, in the temperature regulation and transfer apparatus C, sliders 79a and 79b movable along two guide rails 77 laid in the X-direction are provided, and a temperature regulation and transfer plate 71 is fixed to the sliders 79a and 79b with connecting members 78 and 78. Under the temperature regulation and transfer plate 71, ascending and descending pins 84 for delivering the wafer W are placed to be ascendable and descendable by a driving apparatus. Slots 71a are formed in the temperature regulation and transfer plate 71 so that the ascending and descending pins 84 embedded thereunder can ascend. As this temperature regulating mechanism, temperature control is performed by regulating the temperature of the wafer W at a predetermined temperature, for example, 40° C. by using cooling water, for example. A driving apparatus (not illustrated), for example, by means of air, a motor, or the like is provided in one slider 79a, and a sensor (not illustrated) recognizing an operation position is provided in the other slider 79b.

An air flow path 75c controlling atmospheric pressure which will be described later is formed at the front of the casing 75 (on the left side of FIG. 11), and the flow path 75c communicates with the temperature regulation and transfer apparatus C side via a fan 87a. Further, the flow path 75c leads from the uppermost stage to the lowermost stage in the vertical direction (the Z-direction) although not illustrated. Furthermore, fans 87b are placed at the both side faces of the casing 75 on the heat processing apparatus H side, and exhaust ports 75d are respectively formed therein similarly leading from the uppermost stage to the lowermost stage.

Concerning the fourth processing unit section G4, for example, an opening 75a is provided to receive and send the wafer W from and to the first main wafer transfer portion A1 in one side face of the casing 75 of the temperature regulation and transfer apparatus C side, and an opening 75b is provided to face the window 41a of the second main wafer transfer portion A2 at the other side face. Shutters 76a and 76b that are able to freely open and close are provided in the openings 75a and 75b. The opening and closing operation of the shutters 76a and 76b is performed with a driving section under the integrated control section 8 (not illustrated).

Figure 14:
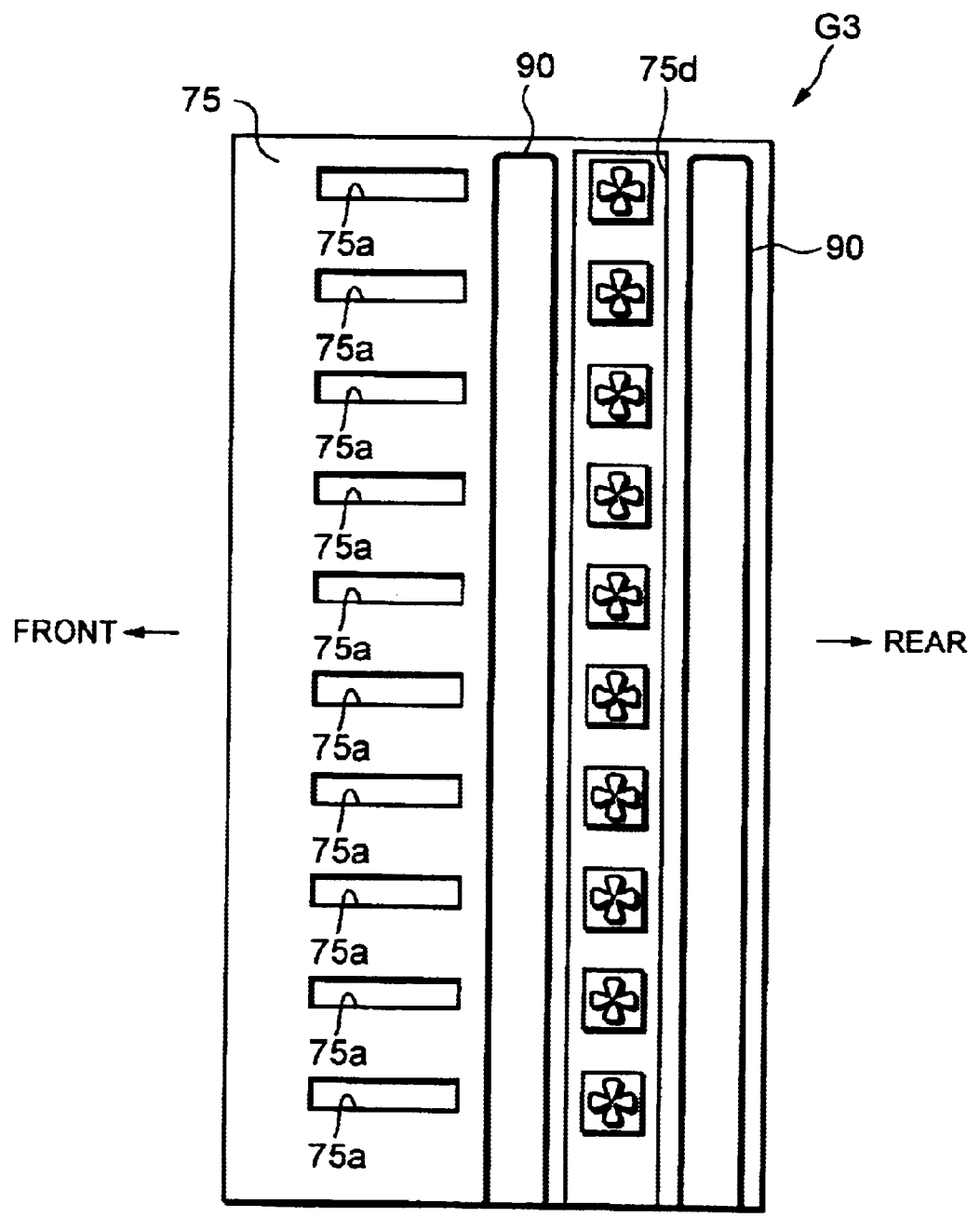
FIG. 14 is a schematic view showing a temperature regulating mechanism of a casing in the thermal processing unit.

FIG. 14 is a side sectional view of the entire fourth processing unit section G4 (the entire fifth processing unit section G5). As illustrated, a temperature regulating pipe 90 for letting cooling water flow in order to inhibit thermal diffusion to the outside of the fourth processing unit section G4 (the fifth processing unit section G5) and inhibit an increase in the temperature of an atmosphere in the apparatus is provided from the uppermost stage to the lowermost stage, and connected to a pump which is not illustrated but provided under the processing unit section G4 (G5) in each side face portion on the heat processing apparatus H side.

Figure 15:
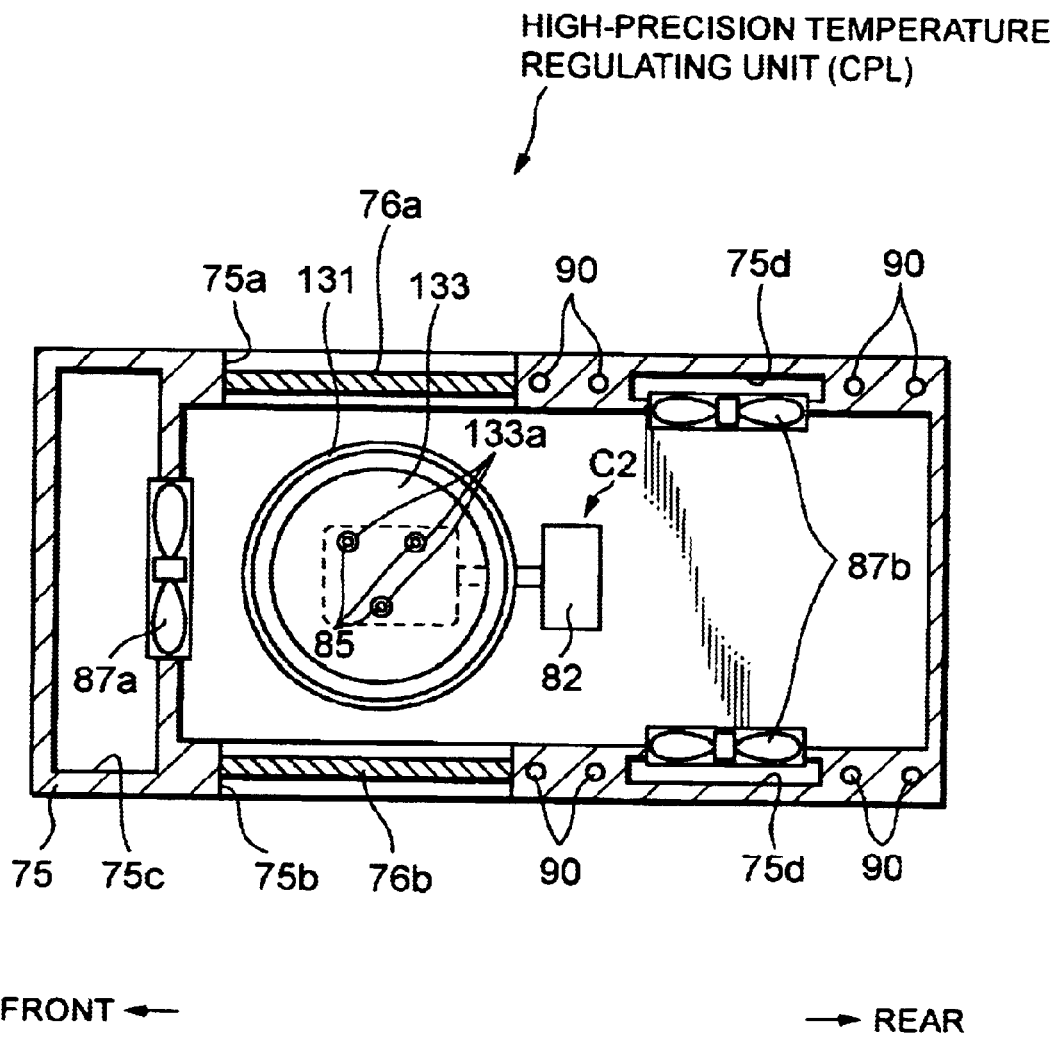
FIG. 15 is a horizontal sectional view of a high-precision temperature regulating unit (CPL) according to the embodiment of the present invention.

Next, the high-precision temperature regulating unit (CPL) as a temperature regulating section that is included in all the heat processing system unit sections (the third to fifth processing unit sections G3 to G5) will be explained with reference to FIG. 15. The aforesaid temperature regulation and transfer apparatus C in the pre-baking unit (PAB) or the like is replaced with a high-precision temperature regulating device C2, and the heat processing apparatus H is eliminated, and hence the same numerals and symbols will be used to designate the same components as those in the pre-baking unit (PAB) or the like, so that the explanation will be omitted.

The high-precision temperature regulating device C2 is provided with a high-precision temperature regulating plate 133 in a cylindrical supporting body 131. In this high-precision temperature regulating plate 133, although not illustrated, Peltier elements, for example, are used, and the temperature of the wafer W is regulated at a predetermined temperature, for example, 23° C. by feedback control, whereby precise temperature control can be performed. Under the supporting body 133, the three pins 85 for delivering the wafer W are placed to be ascendable and descendable by the driving apparatus 82. The three pins 85 are placed while being retracted into through-holes 133a formed in the high-precision temperature regulating plate 133.

Figure 16:
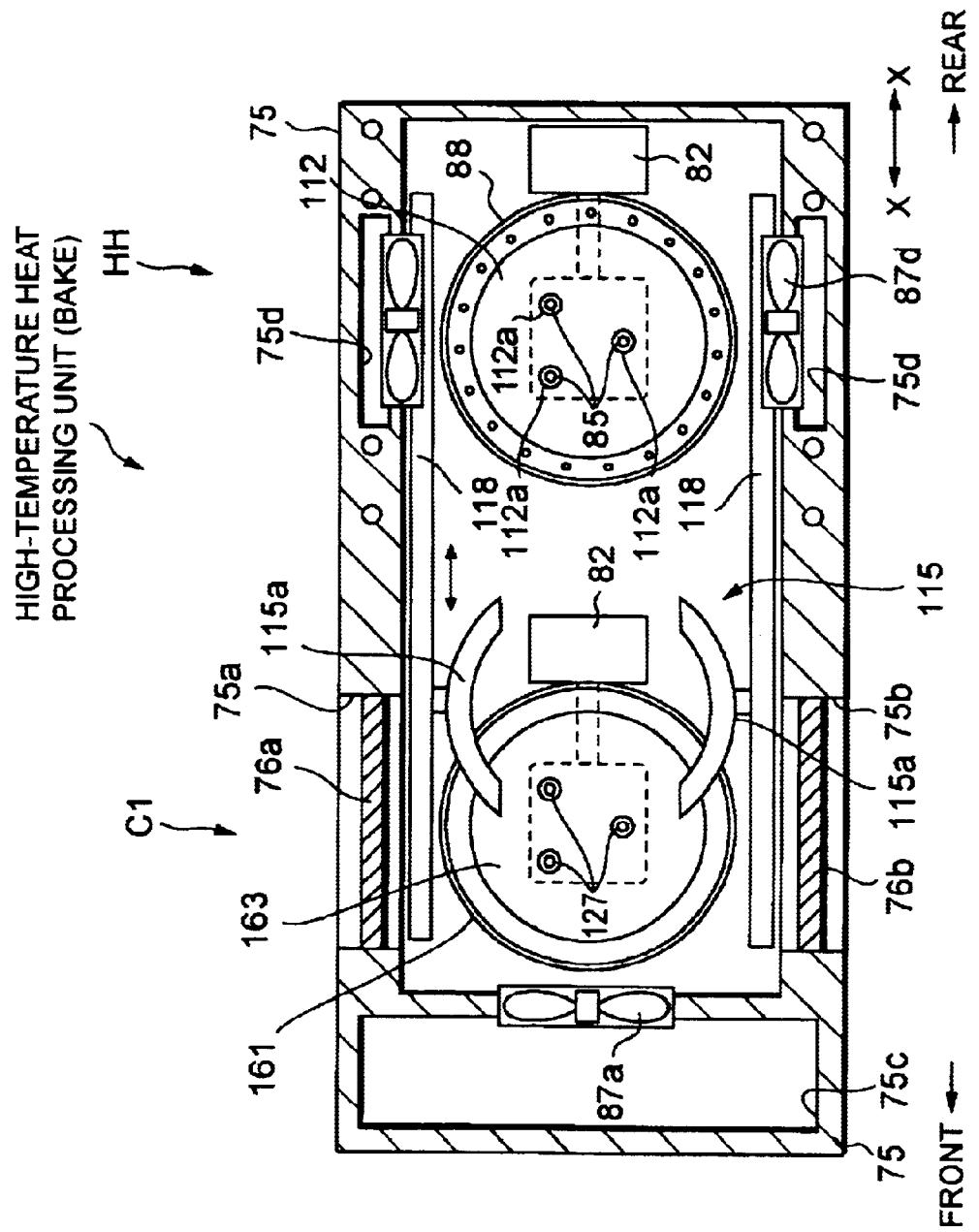
FIG. 16 is a horizontal sectional view of a high-temperature thermal processing unit (BAKE) according to the embodiment of the present invention.

Next, the structure of a high-temperature heating process unit (BAKE) that is included in the third processing unit section G3 is explained referring to FIG. 16. Incidentally, the same numerals and symbols will be used to designate the same components as those in the pre-baking unit (PAB) or the like, so that the explanation will be omitted.

A temperature regulating apparatus C1 as a temperature regulating section is disposed on the front side of the apparatus in the casing 75. The temperature regulating device C1 is provided with a temperature regulating plate 163 in a cylindrical supporting body 161. The temperature of the temperature regulating plate 163 is controlled with using cooling water or the like similarly to the aforesaid pre-baking unit (PAB) or the like. Meanwhile, a high-temperature heat processing apparatus HH for performing heating process at a temperature higher than the heat processing apparatus H in the pre-baking unit (PAB) or the like is disposed on the rear side. In the high-temperature heat processing apparatus HH, likewise with the heat processing apparatus H, a high-temperature hot plate 112 is placed with a proper heat insulating material provided in the cylindrical supporting body 88. Under the supporting body 88, the three pins 85 for delivering the wafer W are placed to be ascendable and descendable by the driving apparatus 82. The three pins 85 are placed while being retracted into through-holes 112a formed in the hot plate 112.

The distance between the temperature regulating device C1 and the high-temperature heat processing apparatus HH is set to be larger than the distance between the temperature regulation and transfer apparatus C and the heat processing apparatus H in the pre-baking unit (PAB) or the like so as to prevent heat processing at a high temperature in the high-temperature heat processing apparatus HH from exerting on a bad influence on temperature regulating process in the temperature regulating device C1.

On both sides of the temperature regulating device C and the high-temperature heat processing apparatus HH, guide rails 118 are laid in the X-direction, and a sub-arm 115 as a sub-transferring portion for transferring the wafer W so as to be movable along the guide rails 118 by a driving apparatus not illustrated is provided. The sub-arm 115 has a pair of hands 115a and 115a.

Although the detailed structure of the temperature regulating unit (TCP) included in the two columns of lower tier of the fourth and fifth processing units G4 and G5 is not illustrated, the temperature regulating unit (TCP) has the same structure as the aforesaid high-precision temperature regulating unit (CPL), and as a temperature regulating mechanism of the temperature regulating unit (TCP), temperature control is given by using cooling water, Peltier elements, or the like. For example, the number of Peltier elements in this case is less than that in the case of the high-precision temperature regulating plate 133.

Figure 17:
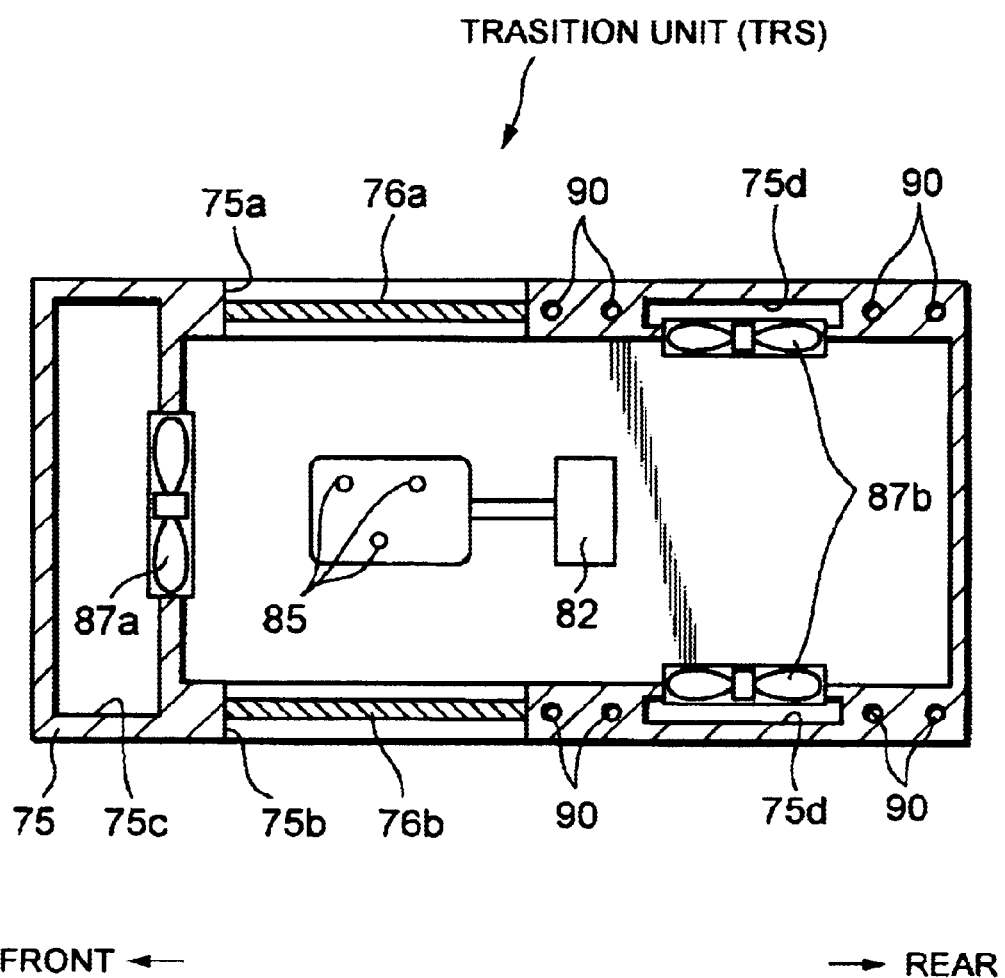
FIG. 17 is a horizontal sectional view of a transition unit (TRS) according to the embodiment of the present invention.

FIG. 17 shows the transition unit (TRS) included in the third processing unit section G3. Different from other heating process units, this has no heat processing system device (for example, the temperature regulating device C1) and has only the ascending and descending pins 85 and a driving apparatus for vertically moving them. Other components in the transition unit (TRS) are the same as those in the high-precision temperature regulating unit (CPL) or the like. Although not illustrated, the aforesaid spare space included in the third processing unit section G3 has only ascending and descending pins and a driving apparatus for vertically moving them for receiving and sending the wafer W from and to other processing units, similarly to the transition unit (TRS).

Incidentally, concerning the device H and HH for heating process illustrated in FIG. 12 to FIG. 17, although not illustrated, the chamber cover, which can freely open and close when heating process is performed on wafer W, is provided on these hot plates 86 and 112.

Next, the structure of a resist coating unit (COT) shown in FIG. 18 and FIG. 19 will be explained.

In this unit, a fan filter unit F for air control which will be described later is mounted at the upper portion of a casing 41', and at the lower portion thereof, an annular cup CP is placed near the center of a unit base plate 151 smaller than the width of the casing 41' in the Y-direction, and a spin chuck 142 is placed therein. The spin chuck 142 is structured to rotate by rotational driving force of a drive motor 143 while the wafer W is fixedly held by vacuum suction. Inside the cup CP, pins 148 for delivering the wafer W are provided to be ascendable and descendable by a driving apparatus 147, and a drain port 145 for drainage is provided. A drain tube 141 is connected to this drain port and leads to an under drain port not illustrated by using a space between the unit base plate 151 and the casing 41'. Drain tubes 141a are connected respectively to a plurality of resist coating units (COT), and thus arranged in a line as illustrated in this processing unit section. Therefore, each drain tube 141a is arranged in one line in the processing unit section as illustrated.

Meanwhile, an air flow path for atmospheric pressure control which will be described later is formed with a space L between the casing 41' and the unit base plate on the opposite side (the right side of FIG. 18), and a fan filter unit F of another resist coating unit (COT) at a stage lower than this resist coating unit (COT) can be seen.

A nozzle 135 for supplying a resist to the front face of the wafer W is connected to a solution supplying mechanism (not illustrated) in the chemical chamber (CHM) 26 (See FIG. 2) by a supply pipe 134. The nozzle 135 is removably attached to a forward end portion of a nozzle scan arm 136 at a nozzle waiting section 146 placed outside the cup CP and moved to a predetermined resist discharge position set above the spin chuck 142. The nozzle scan arm 136 is attached to an upper end portion of a vertical supporting member 149 which is horizontally movable on guide rails 144 laid in one direction (the Y-direction) on a unit base plate 151, and moves in the Y-direction integrally with the vertical supporting member 149 by a Y-directional driving mechanism not illustrated.

The nozzle scan arm 136 is also movable in the X-direction orthogonal to the Y-direction in order that the nozzle 135 is selectively attached thereto depending on the type of resist at the nozzle waiting section 146, and moves in the X-direction by an X-directional driving mechanism not illustrated.

A drain cup 138 is provided between the cup CP and the nozzle waiting section 146, and the nozzle 135 is cleaned at this position prior to the supply of the resist to the wafer W.

A vertical supporting member movable in the Y-direction for supporting a rinse nozzle scan arm 139 as well as the vertical supporting member 149 for supporting the nozzle scan arm 136 is provided on the guide rails 144. A rinse nozzle 140 for side rinse is attached to a forward end portion of the rinse nozzle scan arm 139. The rinse nozzle scan arm 139 and the rinse nozzle 140 move translationally or rectilinearly between a nozzle waiting position (position shown by a full line) set by the cup CP side and a rinse solution discharge position (position shown by a dotted line) set immediately above the peripheral edge portion of the wafer W mounted on the spin chuck 142.

Figure 20:
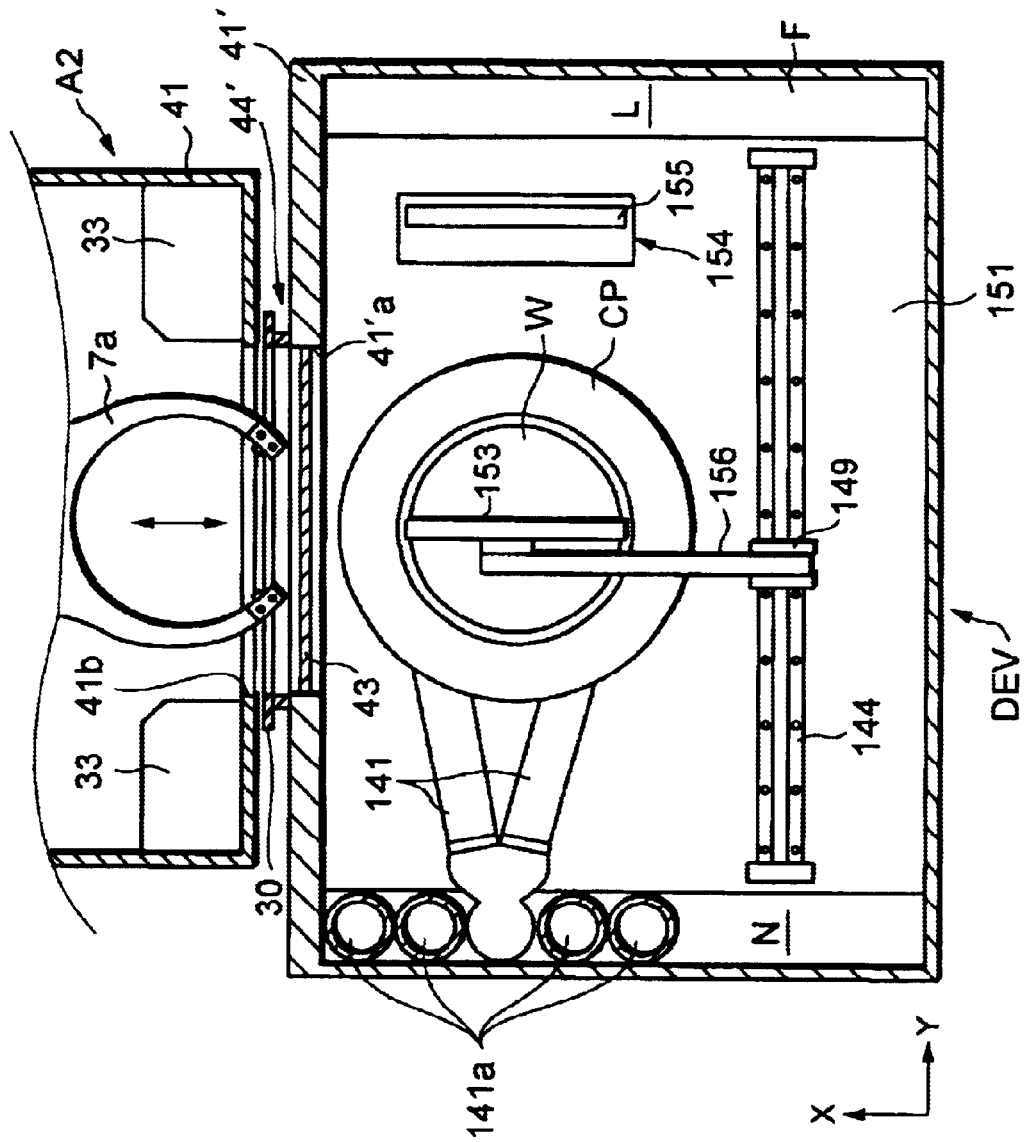
FIG. 20 is a plan view showing a developing unit according to the embodiment of the present invention.
Figure 21:
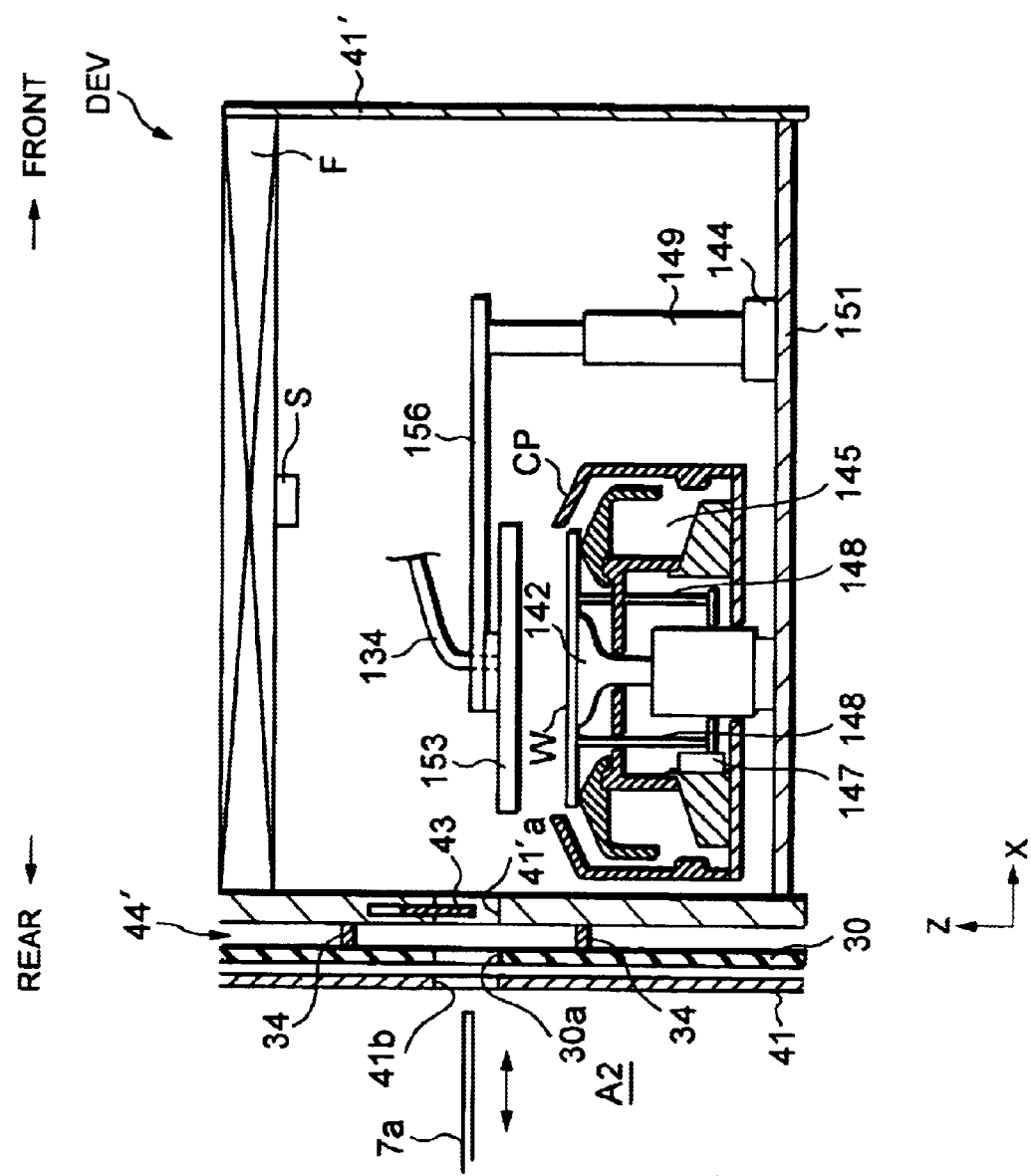
FIG. 21 is a vertical sectional view of the developing unit according to the embodiment of the present invention.

Next, the structure of the developing unit (DEV) shown in FIG. 20 and FIG. 21 will be explained. In this developing unit (DEV), the same numerals and symbols will be used to designate the same components as those in the resist coating unit (COT), so that the explanation thereof will be omitted.

In a nozzle 153 for supplying a developing solution to the front face of the wafer W has a diameter longer than that of the wafer W and a plurality of holes not illustrated for discharging the developing solution are formed therein. A nozzle waiting section 154 is provided on the side of a cup CP, and a rinse nozzle 155 for supplying a rinse solution for rinsing the developing solution on the front face of the wafer W is provided there. The rinse nozzle 155 has the same structure as the nozzle 153. In this nozzle waiting section 154, pre-dispense is performed regularly or as required in order to dispose of the developing solution which has dried and deteriorated at the forward end of the nozzle 135.

Although the nozzle scan arm 136 in the resist coating unit (COT) can move in the X-direction, a nozzle scan arm in this developing unit (DEV) moves only in the Y-direction along the guide rails 144.

As for the bottom coating unit (BARC), only a coating solution in the resist coating unit (COT) is replaced with an anti-reflection film material, so that the explanation of the structure thereof is omitted.

Figure 22:
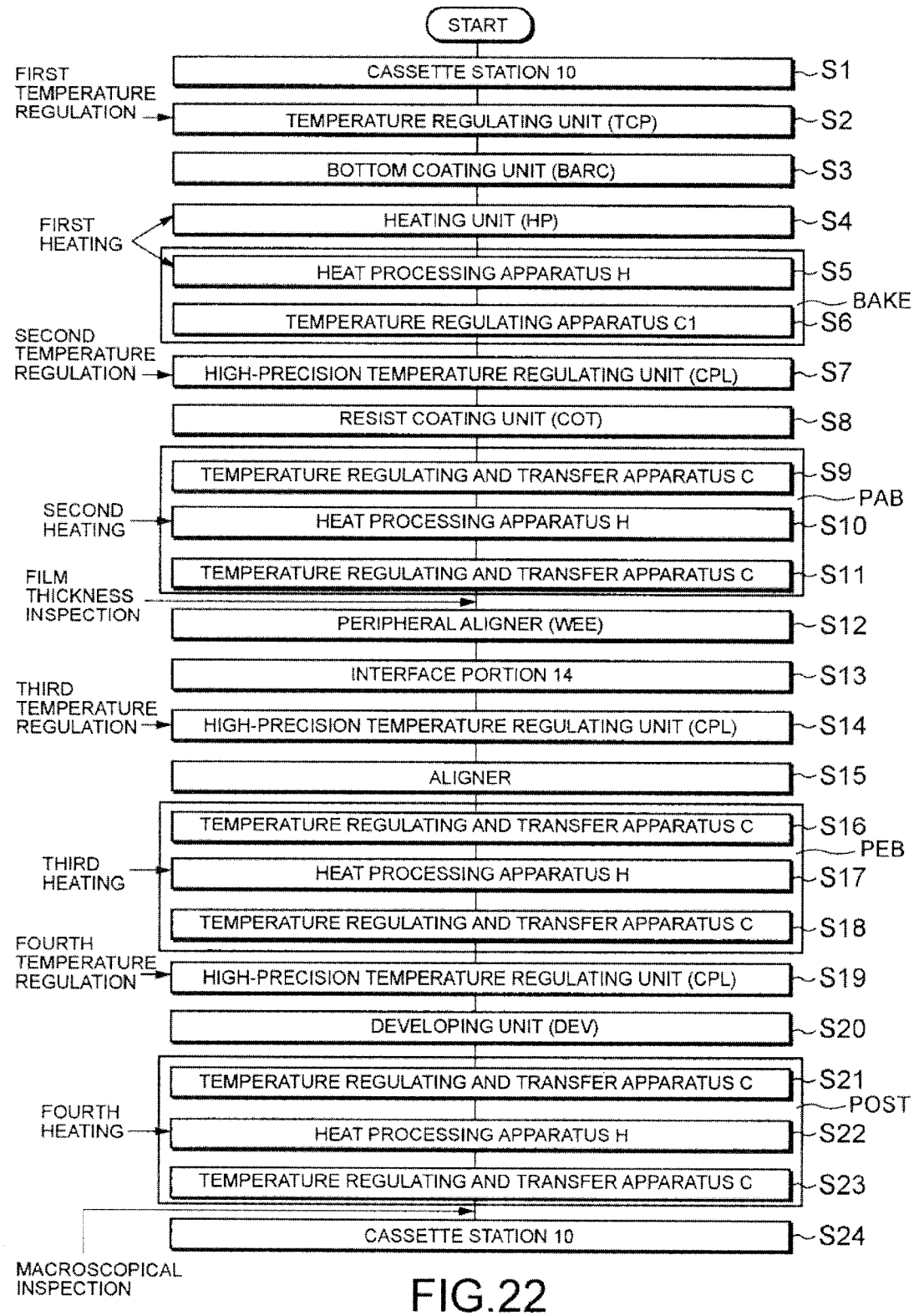
FIG. 22 is a flowchart showing a series of operations of a substrate processing apparatus according to the embodiment of the present invention.

Next, a series of operations in the substrate processing apparatus 1 explained above will be explained with reference to the flow chart shown in FIG. 22.

In the cassette station 10, the wafer transfer mechanism 22 first gets access to the cassette CR housing unprocessed wafers on the cassette mounting table 20 and takes one wafer W out of the cassette CR (S1). After taking the wafer W out of the cassette CR, the wafer transfer mechanism 22 rotates 180° in the θ-direction, the shutter 76a (See FIG. 12 and FIG. 13) of the opening 75a of the temperature regulating unit (TCP) in the third processing unit section G3 opens, a hand of the wafer transfer mechanism 22 is inserted into the casing 75 from the opening 75a, and the wafer W is mounted on the temperature regulating plate. Then, predetermined temperature regulating process (first temperature regulation) is performed (S2).

After temperature regulating process is completed in the temperature regulating unit (TCP), the opening 75b on the opposite side opens, the upper arm 7a of the first main wafer transfer mechanism 16 is inserted therefrom, and the wafer W is delivered to the arm 7a. The main wafer transfer mechanism 16 rotates 90° counterclockwise in FIG. 5, a shutter 43 of the bottom coating unit (BARC) included in the first processing unit section G1 opens, the upper arm 7a is inserted into the casing, the wafer W is mounted at a predetermined position, and an anti-reflection film is formed (S3). As described above, the transfer of the wafer W from the temperature regulation system processing units to the coating system processing units (G1 and G2) is performed only by the upper arm 7a, and the transfer of the wafer W after heating process which will be described later is performed by the middle arm 7b or the lower arm 7c, whereby a heat influence on the wafer W can be held to a minimum.

When the predetermined coating process in the bottom coating unit (BARC) is completed, the shutter 43 opens, the middle arm 7b (or the lower arm 7c) is inserted to receive the wafer W and put back in its original position (inside the casing 41). The wafer W is transferred to the heating unit (HP) 113 to undergo first pre-stage heating process (S4). The heating temperature in this case is, for example, 120° C.

Thereafter, in the high-temperature heating process unit (BAKE) shown in FIG. 16, the shutter 76 shown in FIG. 16 opens, and the middle arm 7b (or the lower arm 7c) of the first main wafer transfer mechanism A1 on which the wafer W is mounted moves in the Y-direction to a position immediately above the temperature regulating device C1. At this time, the sub-arm 115 is waiting in the vicinity of the center of the unit so as not to hinder the movement of the main wafer transfer mechanism 16. The sub-arm 115 on standby moves to a position above the temperature regulating device C1. The ascending and descending pins 127 descend while the wafer W is mounted thereon, and the wafer W is delivered to the sub-arm 115.

The sub-arm 115 which has received the wafer W moves in the X-direction to the rear side, and the wafer W is mounted on the hot plate 112 of the high-temperature heat processing apparatus HH for the next step by the movement of the ascending and descending pins to undergo predetermined first post-stage heating process (S5). In this heating process, the wafer W is heated, for example, at 230° C. for a predetermined period of time.

After the predetermined heat processing by the high-temperature heat processing apparatus HH is completed, the wafer W is moved to the temperature regulating device C1 by the sub-arm 115 and mounted on the temperature regulating plate 163 by the ascending and descending pins 127, and the temperature of the wafer w is regulated at a predetermined temperature there (S6).

The wafer W is then transferred from the high-temperature heating process unit (BAKE) to the first main wafer transfer portion A1 by the first main wafer transfer mechanism 16, and transferred to the high-precision temperature regulating unit (CPL) included in the fourth processing unit section G4 therefrom by the same operation. Predetermined temperature regulating process at 23° C., for example, is performed there (second temperature regulation) (S7).

Figure 18:
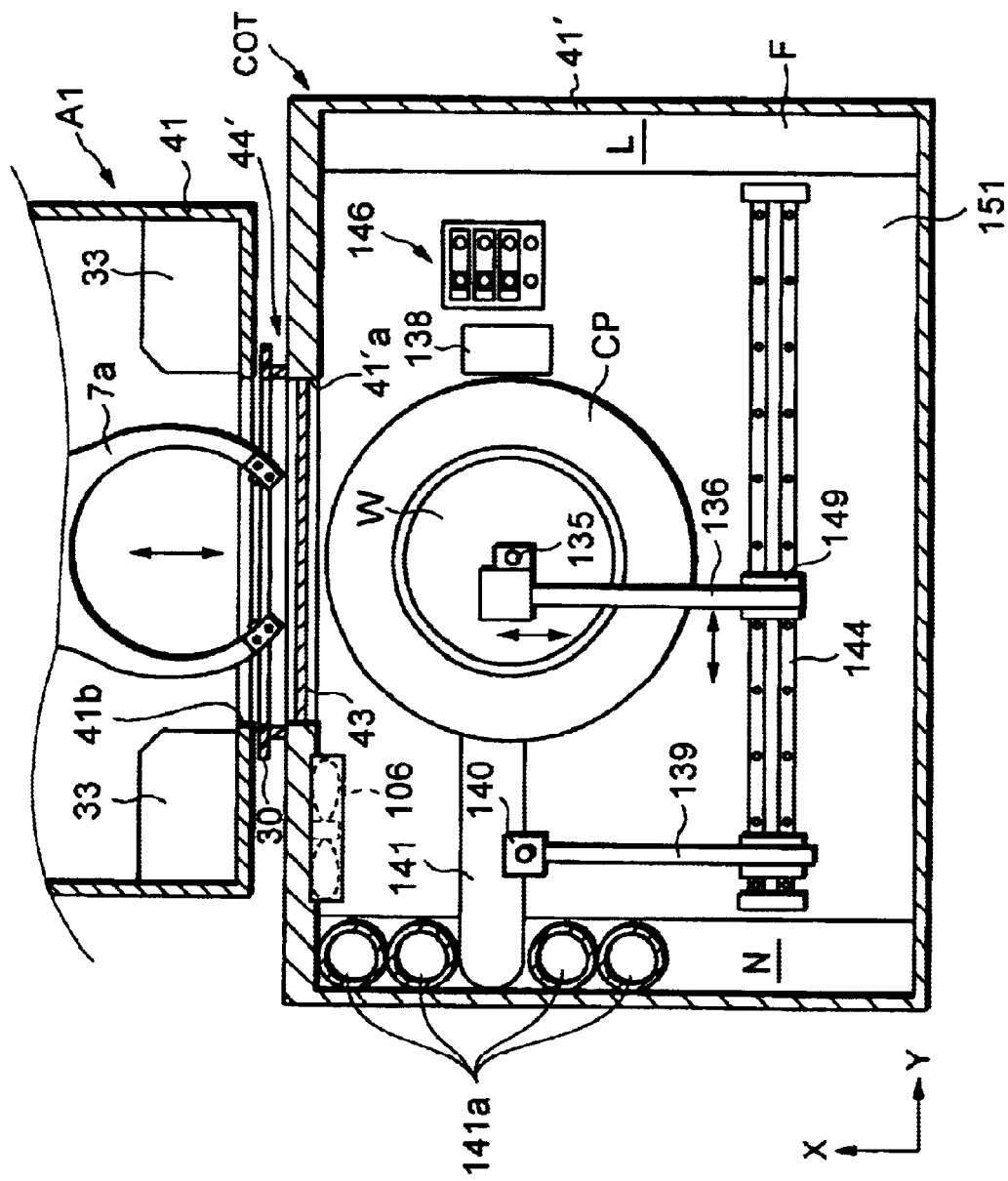
FIG. 18 is a plan view showing a resist coating unit according to the embodiment of the present invention.
Figure 19:
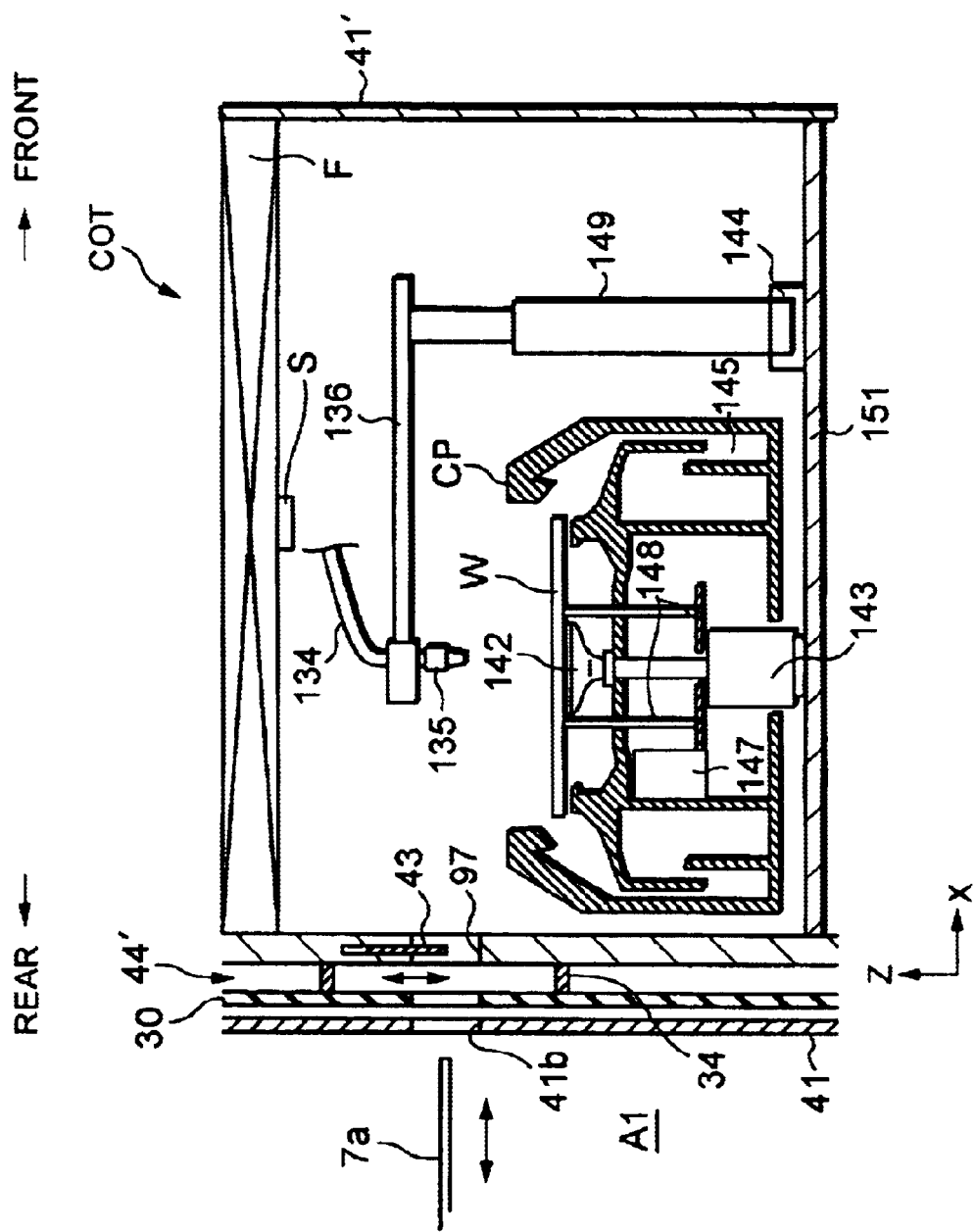
FIG. 19 is a vertical sectional view of the resist coating unit.

When the temperature regulating process is completed, the shutter 43 shown in FIG. 18 opens, and the wafer W is transferred to the resist coating unit (COT) included in the first processing unit section G1 to undergo resist solution coating process (S8).

In the resist coating unit (COT), when the wafer W is transferred to a position immediately above the cup CP, the pins 148 first ascend and then descend after receiving the wafer W, and the wafer W is mounted on the spin chuck 142 and vacuum-sucked. The nozzle 135 which has been waiting at the nozzle waiting section moves to a position above the center of the wafer W shown in FIG. 18 by the mechanisms of the nozzle scan arm 136 and the guide rails 144. After the predetermined resist solution is applied to the center of the wafer W, the wafer W is rotated at 100 rpm to 3000 rpm by the drive motor 143, and the coating of the resist solution is completed by spreading the resist solution over the entire face of the wafer W by centrifugal force.

Figure 23A:
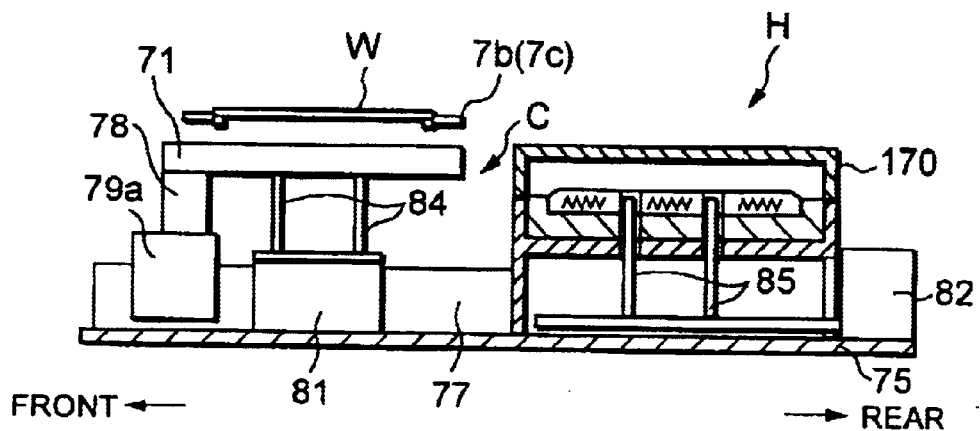
FIGS. 23A, 23B, and 23C are diagrams explaining an operation of sending and receiving a substrate in the thermal processing unit.
Figure 23B:
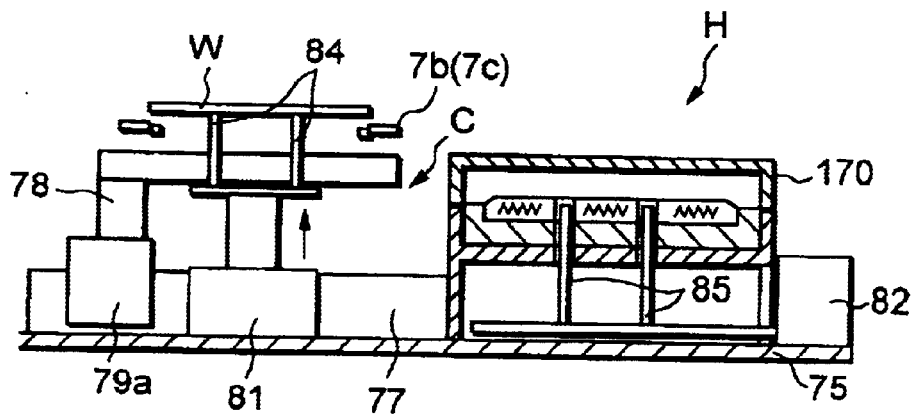
Figure 23C:
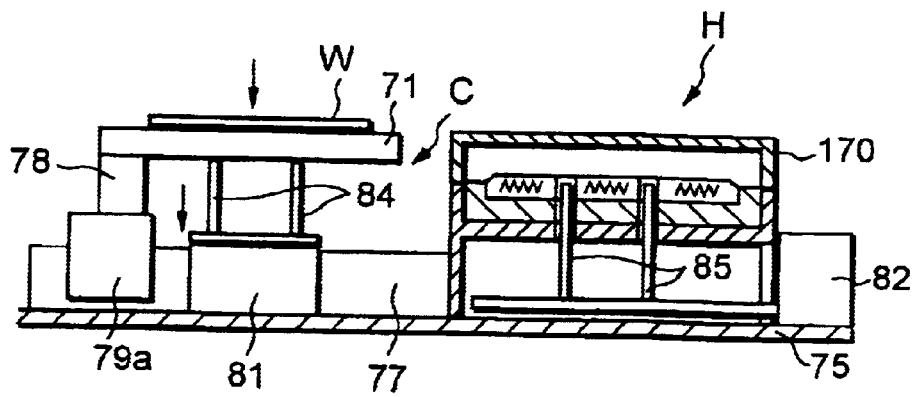

Subsequently, the shutter 76b of the pre-baking unit (PAB) in the fourth processing unit section G4 opens, and the middle arm 7b on which the wafer W is mounted moves in the Y-direction to a position immediately above the temperature regulation and transfer plate 71 as shown in FIG. 23A. Thereafter, as shown in FIG. 23B, the ascending and descending pins 84 ascend, and the wafer W is mounted on the pins. The middle arm 7b is then put back in its original position, the shutter 76b closes, and as shown in FIG. 23C, the ascending and descending pins 84 descend, whereby the wafer W is mounted on the temperature regulation and transfer plate 71 (S9). Incidentally, a chamber cover 170 in the heat treatment equipment H is closed state during the process shown in FIG. 23A to FIG. 23C.

Figure 24A:
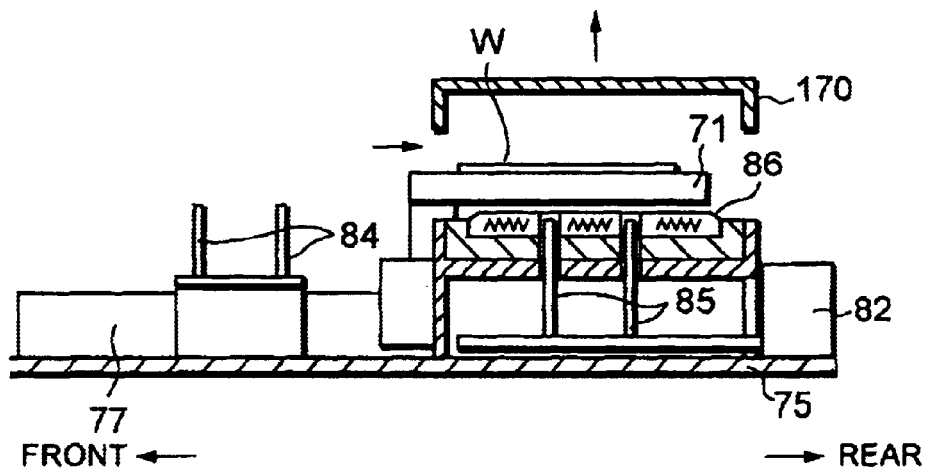
FIGS. 24A, 24B, and 24C are diagrams of an operation of the aforesaid thermal processing unit.
Figure 24B:
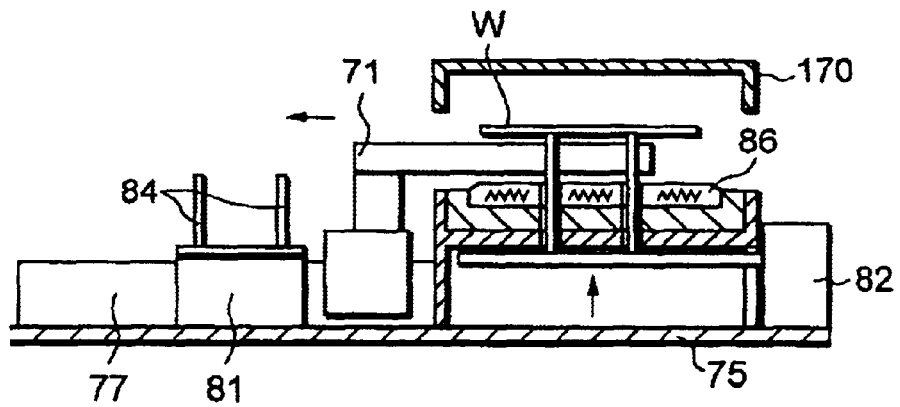
Figure 24C:
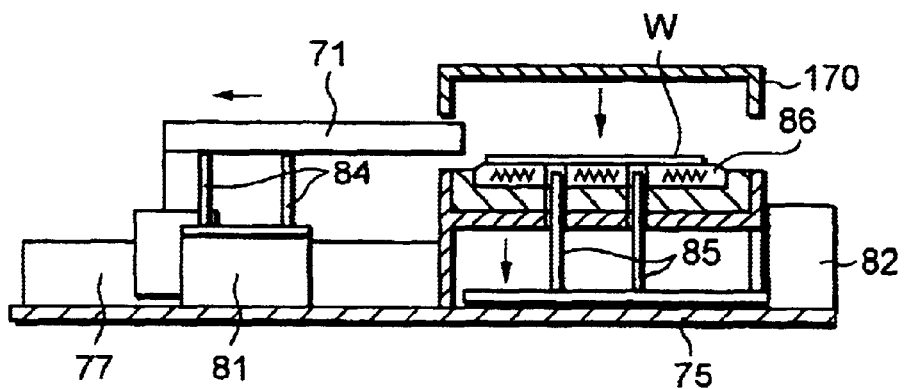

As shown in FIG. 24A, the chamber cover 170 opens upward, and the temperature regulation and transfer plate 71 on which the wafer W is mounted moves to the rear side to a position directly above the hot plate 86. Thereafter, as shown in FIG. 24B, the pins 85 ascend, the wafer W is mounted on the pins. Subsequently, the temperature regulation and transfer plate 71 is put back in its original position, and as shown in FIG. 24C, the pins 85 descend, whereby the wafer W is mounted on the hot plate 86, and the chamber cover 179 closes downward to undergo predetermined second heating process (PAB) (S10). As a result, a remaining solvent is removed from the coating film on the wafer W by evaporation.

After the predetermined heating process by the heat processing apparatus H is completed, operations reverse to the operations shown in FIG. 24 is performed. Specifically, the wafer W is returned to the front side while mounted onto the temperature regulation and transfer plate 71 from the hot plate 86 by the temperature regulation and transfer apparatus C. At this time, the temperature regulation and transfer apparatus C moves to the front side while regulating the temperature of the heated wafer W, for example, at 40° C. (temperature-regulating the wafer W) (S11). Consequently, a time period taken for processing from heating process to temperature regulating process can be shortened, thereby improving throughput.

The wafer W is then taken out of the temperature regulation and transfer apparatus C by the second main wafer transfer mechanism 17 by operations reverse to the operations explained by means of FIG. 23, and transferred to the film thickness inspection portion 119 and the peripheral aligner unit portion 120 through the window 38a of the door 38 shown in FIG. 5. After predetermined film thickness inspection and substrate edge exposing process are performed there (S12), the wafer W is delivered to the ascending and descending pins 84 of the temperature regulation and transfer apparatus C in the fifth processing unit section G5 by the second main transfer mechanism 17 and then transferred from the interface section 14 (S13) to the aligner not illustrated (S15) by the wafer transfer mechanism 204. In the interface portion 14, the wafer W taken out of the fifth heating process unit portion G5 is transferred to the in-stage 203a in the aligner 203 through the wafer transfer mechanism, the in-buffer cassette INBR, the wafer transfer mechanism 204, the peripheral aligner WEE, the wafer transfer mechanism 204, the high precision temperature regulating unit CPL, and the wafer transfer mechanism 206.

After exposing process is completed, the wafer W is transferred to a post exposure baking unit (PEB) included in the fifth processing unit section G5 through the interface portion 14 by the wafer transfer mechanism 204. Specifically, the wafer W taken out of an out stage 203b in the aligner 203 is carried out to the post exposure baking unit (PEB) included in the fifth thermal processing unit section G5 through the wafer transfer mechanism 206, the transition unit TRS, the wafer transfer mechanism 204, and the post exposure baking unit (PEB).

Subsequently, in the post exposure baking unit (PEB) included in the fifth heating process unit portion G5, the wafer W is transferred from the wafer transfer mechanism 204 to the temperature regulation and transfer apparatus C (S16), and from the temperature regulation and transfer apparatus C to the heat processing apparatus H by operations similar to the operations explained in S9 to S11, and then undergoes heating process with the heat processing apparatus H (third heating) (S17).

Figure 25:
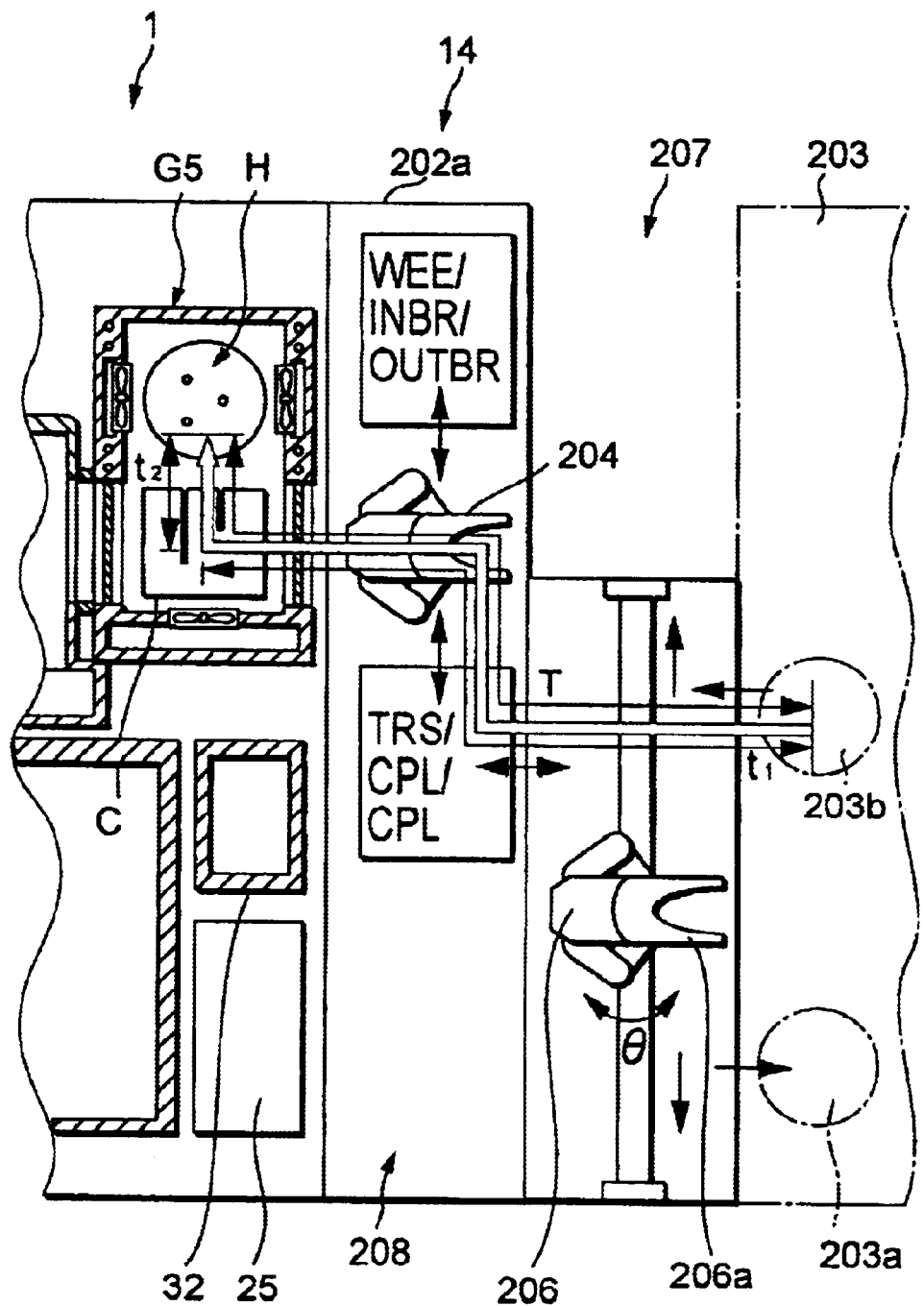
FIG. 25 is a diagram explaining a movement of a wafer transfer mechanism according to the present invention.

In this embodiment, as illustrated in FIG. 25, the controller 8 controls time so that the time period for the wafer W transferred to the heat processing apparatus in the post exposure baking unit (PEB) through the out stage 203b in the aligner 203, the wafer transfer mechanism 206, the transition unit TRS, the wafer transfer mechanism 204, and the temperature regulation and transfer apparatus C in the post exposure baking unit (PEB) can be approximately constant. Incidentally, the time counting may be started, for example, with inputting a substrate ejecting signal to an input port (not illustrated) that acts as a trigger. The substrate ejecting signal is a signal emitted by the aligner 203 allowing the wafer transfer mechanism 206a in the interface portion 14 to receive the wafer W placed on the out stage 203b.

For example, time controlling of this kind is performed with controlling a speed V in transferring the wafer W to the heat processing apparatus H in the post exposure baking unit (PEB) with the temperature regulation and transfer apparatus C in the post exposure baking unit (PEB). More specifically, when a time period taken in transferring the wafer W to the temperature regulation and transfer apparatus C in the post exposure baking unit (PEB) through the out stage 203b at the aligner 203, the wafer transfer mechanism 206, the transition unit TRS, and the wafer transfer mechanism 204 is defined as T1 and when a time period taken in transferring the wafer W to the heat processing apparatus H in the post exposure baking unit (PEB) through the temperature regulation and transfer apparatus C in the post exposure baking unit (PEB)is defined as T2, the temperature regulation and transfer apparatus C in the post exposure baking unit (PEB) controls the speed V in transferring the wafer W to the heat processing apparatus H in the post exposure baking unit (PEB) with the temperature regulation and transfer apparatus C in the post exposure baking unit (PEB), so that t1+t2 becomes constant, namely by controlling t2. In this case, for example, when the time period taken in transferring the wafer W received from the aligner to the temperature regulating and transfer apparatus C through the interface portion 14 (i.e. t1), is shorter than the predetermined time period, the wafer W is kept awaited while being placed on the temperature regulation and transfer apparatus C, alternatively, the speed V is made slower. (In other words, t2 is made longer). When the time period ti is the same as the predetermined time period, transfer of the wafer W by the temperature regulation and transfer apparatus C is performed right after the receipt thereof. When t1 is longer than the predetermined time period, the speed V may be increased. (Namely, t2 is made shorter)

As described above, according to the embodiment of the present invention, a time period T that is a time period taken with the wafer W to be transferred to the heat processing apparatus H in the post exposure baking unit (PEB) through the out stage 203b in the aligner 203, the wafer transfer mechanism 206, the transition unit TRS, the wafer transfer mechanism 204, and the temperature regulation and transfer apparatus C in the post exposure baking unit (PEB) is controlled to be approximately constant. Thus, the time period from the exposing process until the heating process can be kept constant, which results in keeping the circuit pattern formed on the wafer W to be kept uniform.

In addition, in the aforesaid embodiment, the distances between the wafer W received from the aligner 203 and each of the post exposure units (PEB) through the interface portion 14 are different since the post exposure units (PEB) are disposed multi-staged from top to bottom. Therefore, for example, differences in the time period taken in transferring the wafer W (t1) may be adjusted by controlling the a transferring speed of the wafer W with the wafer transfer mechanism 204 in the interface portion 14. Additionally, when the differences cannot be adjusted in the interface portion 14, the speed V may be complementarily adjusted with the temperature regulation and transfer apparatus C.

Thereafter, the wafer W is transferred while regulating the temperature, for example, at about 40° C., by the temperature regulation and transfer apparatus C, taken out by the second main wafer transfer mechanism 17 in the second main wafer transfer portion A2.

Subsequently, the wafer W is subjected to temperature regulating process, for example, at 23° C. in the high-precision temperature regulating unit (CPL) included in the fifth processing unit section G5 (fourth temperature regulation) (S19), then being transferred to the developing unit (DEV) included in the second processing unit section G2 by the main wafer transfer mechanism 17 to undergo coating process of the developing solution (S20).

In this developing unit (DEV), when the wafer W is transferred to a position right above the cup CP, the pins 148 first ascend and then descend after receiving the wafer W, and the wafer W is mounted on the spin chuck 142 and vacuum-sucked. The nozzle 135 which has been waiting at the nozzle waiting section moves to a position above the periphery of the wafer W by the mechanisms of the nozzle scan arm 136 and the guide rails 144. While the wafer W is being rotated, for example, at 10 rpm to 100 rpm by the drive motor 143 and the nozzle 135 moves from the periphery of the wafer W in the Y-direction, coating of the predetermined developing solution is performed by the centrifugal force of rotation.

The wafer W is then transferred to the post-baking unit (POST) included in the fourth processing unit section G4. Also in this case, by operations similar to the operations explained in S9 to S11 and S16 to S18, the wafer W is transferred from the main wafer transfer mechanism 17 to the temperature regulation and transfer apparatus C (S21), then transferred from the temperature regulation and transfer apparatus C to the heat processing apparatus H to undergo heating process by the heat processing apparatus H (fourth heating) (S22). The wafer W is transferred while the temperature of the wafer W is being controlled by the temperature regulation and transfer apparatus C (S23), and this time taken out by the first main wafer transfer mechanism 16 in the first main wafer transfer portion A1. In this heating process, the wafer W is heated, for example, at 100° C. for a predetermined time period. As a result, the resist swelled due to developing is cured, and chemical resistance is improved.

The wafer W is then transferred to the spare space in the third processing unit section G3 by the main wafer transfer mechanism 16 and returned to the cassette CR of the cassette station 10 by the wafer transfer mechanism 22 (S24). In this case, processing un-uniformity and the like on the wafer W are sometimes inspected macroscopically by the naked eye by means of a macroscopic inspection apparatus which is not illustrated but provided on the rear side of the cassette station 10 before the wafer W is returned to the cassette CR of the cassette station 10. In addition to the aforesaid macroscopic inspection, pattern defects after developing, line width, registration/overlay accuracy, and the like may be inspected. Such a macroscopic inspection apparatus may be placed outside so as to protrude from the rear side of the cassette station 10, or may be placed inside the cassette station 10.

As explained above, the wafer W is transferred while the temperature of the wafer W is regulated immediately after the first heating (S5), the second heating (S10), the third heating (S17), and the fourth heating (S22), whereby the time taken for temperature regulating process in the second temperature regulation (S7), the third temperature regulation (S14), and the fourth temperature regulation (S19) as the following steps can be reduced, thus improving throughput.

Each of the thermal processing unit sections, G3 to G5 has ten-staged structure, each of the coating process unit sections, G1 and G2, has five-staged structure, and moreover, the processing unit sections G1 to G5 are arranged to surround the first main wafer transfer portion A1 and the main wafer transfer portion A2 of 21, which enables to a large number of substrates to be processed quickly and enables to the main wafer transfer bodies 16 and 17 to get access to respective units efficiently, leading to contribution to an increase in throughput.

In addition by performing the heating process with the heat processing apparatus H via the temperature regulation and transfer apparatus C from the main wafer transfer bodies 16 and 17, temperature of the wafer W is always maintained at a predetermined value with the temperature regulation and transfer apparatus C before the performance of heating process. Hence, a difference in processing state does not occur even if the heating process time is fixed, and the heat history of the wafer W in the whole substrate processing can be fixed.

As shown in FIG. 1, the temperature regulation system apparatus C1, C2, and C are placed between the heat processing apparatus H and high-temperature heat processing apparatus HH and the like in the processing unit sections G3 to G5 of each of the heat processing systems and the coating system processing unit sections G1 and G2, whereby the heat influence of the heat processing apparatus H and high-temperature heat processing apparatus HH, and the like in the coating system processing unit sections G1 and G2 can be held to a minimum.

Meanwhile, the portions between the main wafer transfer portions A1 and A2 and the processing unit sections G1 to G5 are surrounded by the surrounding members 44 and 44', whereby the entry of particles to the processing units and the transferring portions can be prevented.

As for these surrounding members 44 and 44', as shown in FIG. 5, the gap U is provided between each of the surrounding members 44 of the first and the second main wafer transfer portions A1 and A2, and each of the processing units, whereby vibration caused by the transfer of the main wafer transfer portions A1 and A2 is not transmitted to the processing units, resulting in certain performance of heat processing and coating process.

Furthermore, keeping the substrate awaited at the interface portion 14 side can be avoided with using both of the wafer transfer mechanism 204 and 206. As a result, the time period taken in transferring the substrate from the aligner 203 to the heat processing apparatus H can be shortened while controlling time. Consequently, the throughput can be improved and the circuit pattern formed on the wafer W can be kept uniform, and the wafers of high quality can be produced efficiently.

It should be noted that the present invention is not limited to the embodiments explained above. For example, the present invention can be applied not only to the semiconductor wafer but also to a glass substrate used for a liquid crystal display device and the reticle substrate used for photo mask and the like.

As described above, according to the present invention, a time period taken from the exposing process to the heating process can be kept constant, thus the line width of circuitry pattern formed on the substrate can be kept constant.

The disclosure of Japanese Patent Application No. 2001-186075 filed Jun. 20, 2001 including specification, drawings and claims are herein incorporated by reference in its entirety.

Although only some exemplary embodiments of this invention have been described in details as above, those skilled in the art should readily appreciate that many modifications are possible in the exemplary embodiments without materially departing from the novel teachings and advantages of this invention. Accordingly, all such modifications are intended to be included within the scope of this invention.

What is claimed is:

1. A substrate processing apparatus, performing a developing process for a substrate exposed by an aligner, comprising:
   at least one heat processing portion heat processing the substrate before the developing process;
   an interface portion, disposed between the heat processing portion and the aligner, sending and receiving the substrate between the heat processing portion and the aligner; and
   a controller controlling a time period taken in transferring the substrate received from the aligner to the heat processing portion through the interface portion before starting the heating process on the substrate with the heat processing portion so that the time period becomes approximately constant; and
   wherein the heat processing portion has a heat processing plate performing the heating process for the substrate, and a first transferring portion receiving the substrate from the interface portion and transferring the substrate to the heat processing plate, and the controller controls a transferring speed that the first transferring portion transfers the substrate so that the time period taken in transferring the substrate received from the aligner to the heat processing portion through the interface portion before starting the heating process on the substrate with the heat processing portion becomes approximately constant.

2. The substrate processing apparatus, as set forth in claim 1, wherein the interface portion has a transferring system transferring the substrate at a constant speed; and
   wherein the controller at least one of allowing the substrate to wait at the first transferring portion for a while and decreasing the transferring speed of the first transferring portion when a transferring time of the substrate received from the aligner and transferred to the heat processing portion through the interface portion is shorter than a predetermined time period, the controller allows the first transferring portion to start the transportation immediately after receiving the substrate when the transferring time is the same as the predetermined time period, and the controller allows the first transferring portion to increase the transferring speed when the transferring time is longer than the predetermined time period.

3. The substrate processing apparatus, as set forth in claim 1, wherein the first transferring portion has a portion controlling a temperature of the substrate.

4. A substrate processing apparatus, performing a developing process for a substrate exposed by an aligner, comprising:
   a plurality of heat processing portions disposed in multiple stages in a vertical direction, heat processing the substrate before the developing process;
   an interface portion, disposed between the heat processing portions and the aligner, having a transferring system transferring the substrate from the aligner to the heat processingportions; and
   a controller controlling a time period taken in transferring the substrate received from the aligner to one of the heat processing portions through the interface portion before starting the heating process on the substrate with the heat processing portion so that the time period becomes approximately constant.

5. The substrate processing apparatus, as set forth in claim 4,
   wherein each of the heat processing portions has the heat processing plate performing the heating process for the substrate, and the first transferring portion receiving the substrate from the interface portion and transferring the substrate to the heat processing plate,
   wherein the controller controls the transferring time with controlling the transferring speed of the first transferring portion when the transferring time is unable to be adequately controlled with the transferring system.

6. The substrate processing apparatus, as set forth in claim 1, wherein the interface portion has a first interface portion disposed adjacent to the heat processing portion, and a second interface portion disposed between the first interface portion and the aligner;
   wherein the first interface portion has a second transferring portion transferring the substrate between the heat processing portion and the second interface portion; and
   wherein the second interface portion has a third transferring portion transferring the substrate between the first interface portion and the aligner.

7. The substrate processing apparatus, as set forth in claim 6,
   wherein the first interface portion has a first holding portion holding the substrate transferred to the heat processing portion for a while, and a second holding portion holding the substrate transferred to the aligner for a while; and
   wherein the second interface portion has a transitional portion holding the substrate transferred between the first interface portion and the second interface portion for a while, a wafer transfer mechanism transferring the substrate by getting access with the heat processing portion, the first holding portion and the second holding portion and the transitional portion.

8. A substrate processing apparatus, performing a developing process for a substrate exposed by an aligner, comprising:

at least one heat processing portion heat processing the substrate before the developing process;

an interface portion, disposed between the heat processing portion and the aligner, sending and receiving the substrate between the heat processing portion and the aligner;

a controller controlling a time period taken in transferring the substrate received from the aligner to the heat processing portion through the interface portion before starting the heating process on the substrate with the heat processing portion so that the time period becomes approximately constant; and a signal input port inputting a substrate ejecting signal coming from the aligner; and wherein the controller starts counting time in a process of controlling the time period to be constant in accordance with the substrate ejecting signal inputted in the signal input port.

9. A substrate processing method performing a heating process in a heat processing portion before performing a developing process for a substrate exposed with an aligner, comprising the steps of:

transferring the substrate from the aligner to the heat processing portion having a heat processing plate performing a heating process for the substrate and a first transferring portion transferring the substrate to the heat processing plate at least in one part of the transferring steps; and controlling a transferring speed that the first transferring portion transfers the substrate so that the time period taken from the completion of an exposing process until the heating process is started on the substrate with the heat processing portion become approximately constant.

10. The substrate processing method, as set forth in claim 9, wherein the controlling process of the controller includes, at least one of allowing the substrate to wait at the first transferring portion for a while and decreasing the transferring speed of the first transferring portion when a transferring time is shorter than a predetermined time period, allowing the first transferring portion to start the transportation immediately after receiving the substrate when the transferring time is the same as the predetermined time period, and allowing the first transferring portion to increase the transferring speed when the transferring time is longer than the predetermined time period.

11. A substrate processing method performing a heating process in a heat processing portion before performing a developing process for a substrate exposed with an aligner, comprising the steps of:

transferring the substrate from the aligner to the heat processing portion; and controlling a time period so that the time period taken in transferring the substrate received from the aligner to the heat processing portion before starting the heating process on the substrate with the heat processing portion becomes approximately constant;

inputting a substrate ejecting signal from the aligner; and start counting time in a time controlling process in accordance with the substrate ejecting signal inputted in the signal input port.

* * * * *